United States Patent
Kasahara

(10) Patent No.: US 6,358,766 B1
(45) Date of Patent: Mar. 19, 2002

(54) METHOD OF FABRICATING A SEMICONDUCTOR DEVICE

(75) Inventor: Kenji Kasahara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 16 days.

(21) Appl. No.: 09/598,827

(22) Filed: Jun. 21, 2000

(30) Foreign Application Priority Data

Jun. 22, 1999 (JP) .......................................... 11-176127

(51) Int. Cl.$^7$ .............................................. H01L 21/00
(52) U.S. Cl. ........................... 438/30; 438/50; 438/151; 438/149
(58) Field of Search ........................... 438/30, 50, 151, 438/149, 150, 158, 31, 32; 257/57, 53, 56, 72, 59, 60, 61, 62

(56) References Cited

U.S. PATENT DOCUMENTS

| | | | |
|---|---|---|---|
| 4,704,784 A | * 11/1987 | Szydlo | 437/41 |
| 5,153,690 A | * 10/1992 | Tsukada et al. | 357/23.7 |
| 5,266,825 A | * 11/1993 | Tsukada et al. | 257/366 |
| 5,306,651 A | * 4/1994 | Masumo et al. | 437/40 |
| 5,643,826 A | 7/1997 | Ohtani et al. | 437/88 |
| 5,814,530 A | * 9/1998 | Tsai et al. | 438/30 |
| 5,894,137 A | * 4/1999 | Yamazaki et al. | 257/66 |
| 5,923,962 A | 7/1999 | Ohtani et al. | 438/150 |
| 5,956,581 A | * 9/1999 | Yamazaki et al. | 438/166 |
| 5,959,312 A | * 9/1999 | Tsai et al. | 257/57 |
| 5,981,934 A | * 11/1999 | Kigashikawa | 250/214 |
| 6,048,672 A | * 4/2000 | Cameron et al. | 430/327 |
| 6,150,692 A | * 11/2000 | Iwanaga et al. | 257/315 |

FOREIGN PATENT DOCUMENTS

| | | | |
|---|---|---|---|
| JP | 7-130652 | 5/1995 | |
| JP | 0176127 | * 1/2001 | 29/786 |

OTHER PUBLICATIONS

Ishihara, R. et al, "Location Control of Large Grain Following Excimer–Laser Melting of Si Thin–Films," *Jpn. J. Appl. Phys.*, vol. 37, part 1, No. 3B, pp. 1071–1075, Mar., 1998.
English abstract re Japanese Patent Application No. JP 7–130652, published May 19, 1995.

* cited by examiner

*Primary Examiner*—Charles Bowers
*Assistant Examiner*—Laura M. Schillinger
(74) *Attorney, Agent, or Firm*—Cook, Alex, McFarron, Manzo, Cummings & Mehler, Ltd.

(57) ABSTRACT

A substrate (901 in FIGS. 1A and 1B) is overlaid with a base film (902), an amorphous semiconductor film (903) and a first protective insulating film (904), and a thermal conduction layer (905) having a light transmissivity is selectively formed. Subsequently, the amorphous semiconductor film (903) is crystallized by laser annealing. The thermal conduction layer (905) functions to control the outflow rate of heat from the semiconductor film (903), and a crystalline semiconductor film centering round a region formed with the thermal conduction layer (905) is prepared by utilizing the difference of temperature distributions over the substrate (901). In the crystalline semiconductor film thus prepared, the location and size of a crystal grain have been controlled. A TFT capable of high-speed operation is realized by employing the crystalline semiconductor film as the channel forming region of the TFT.

28 Claims, 25 Drawing Sheets

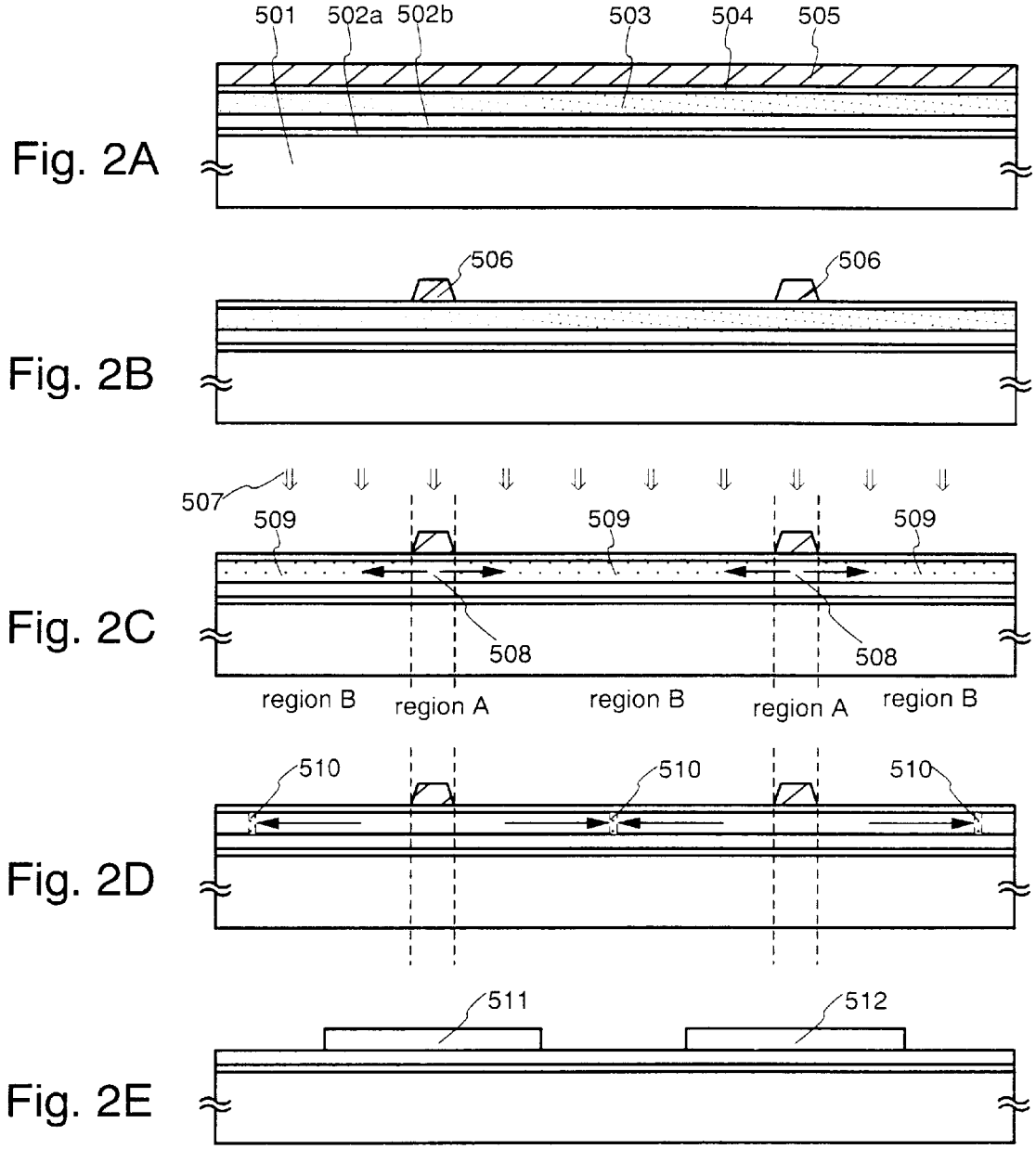

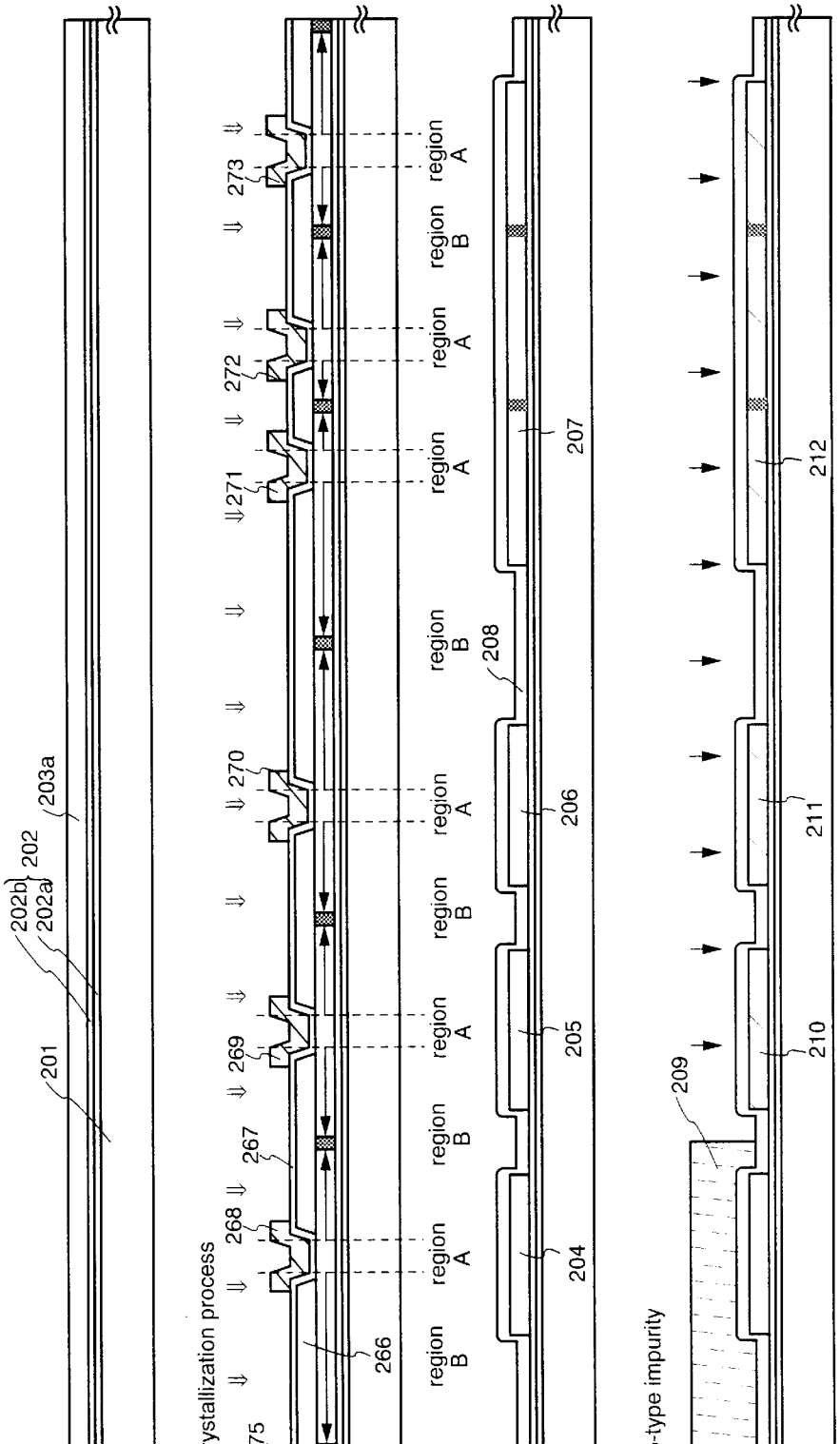

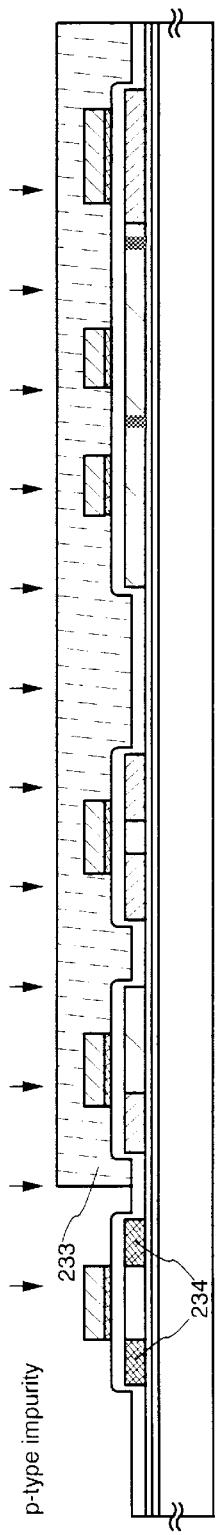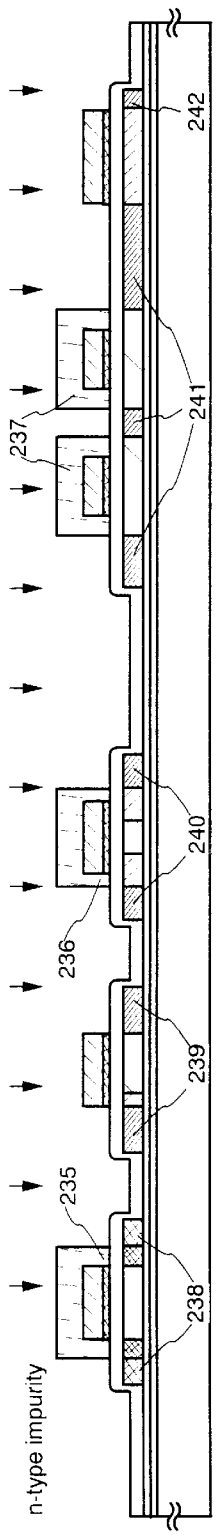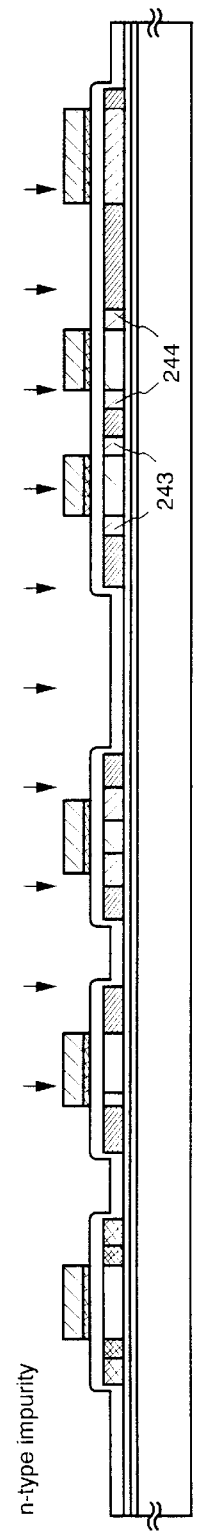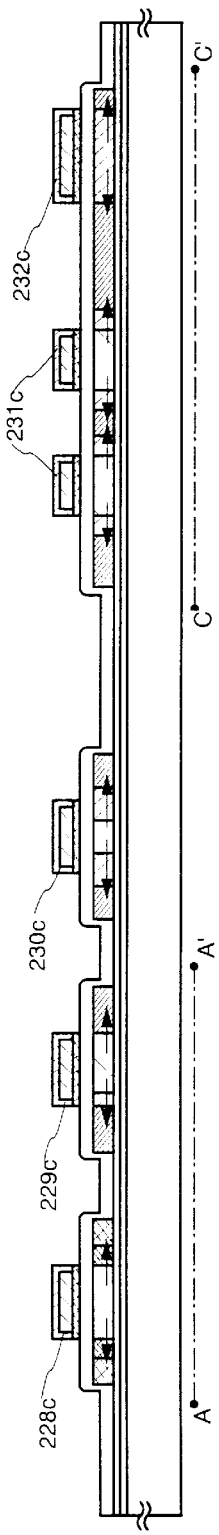

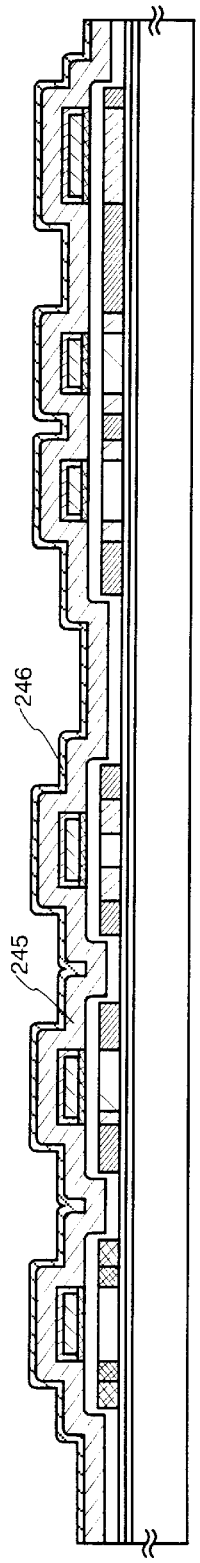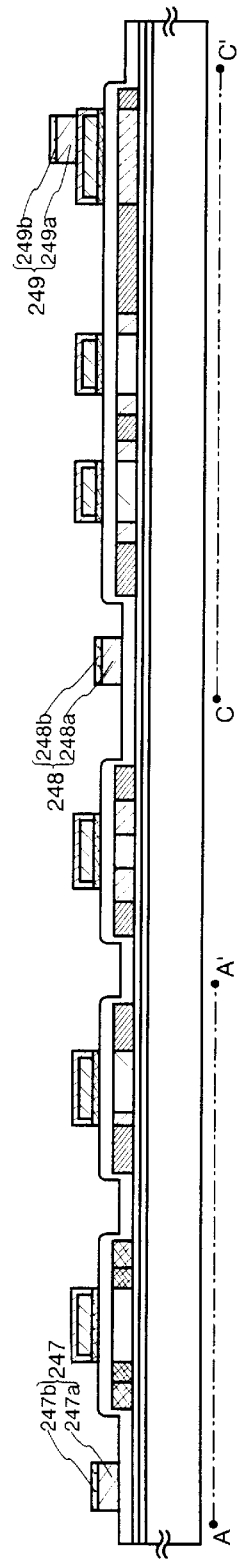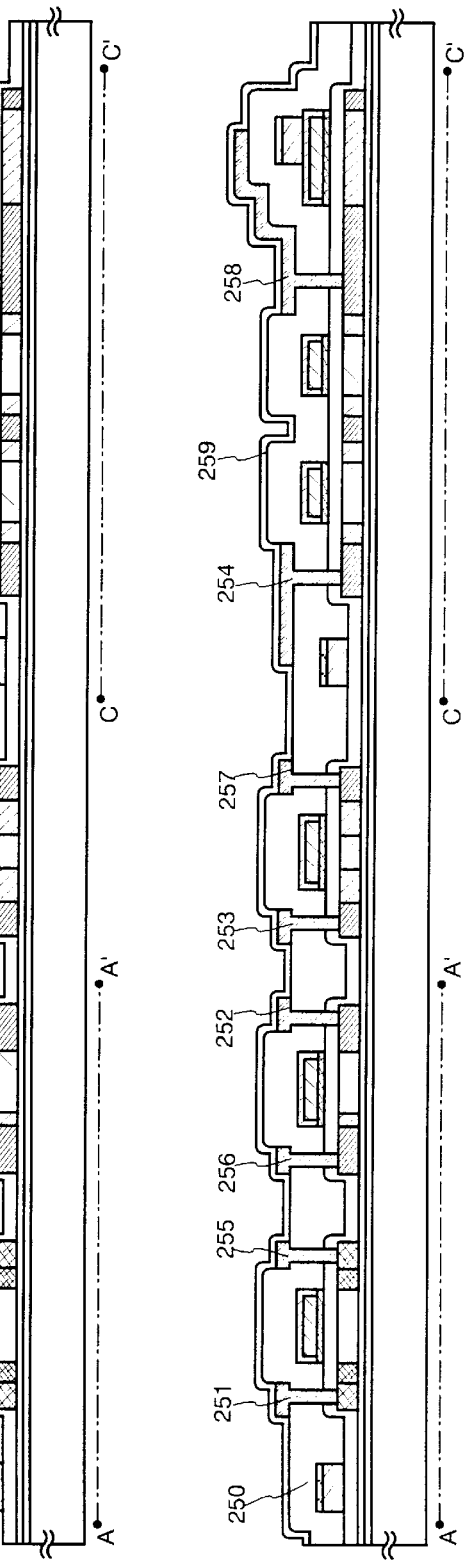

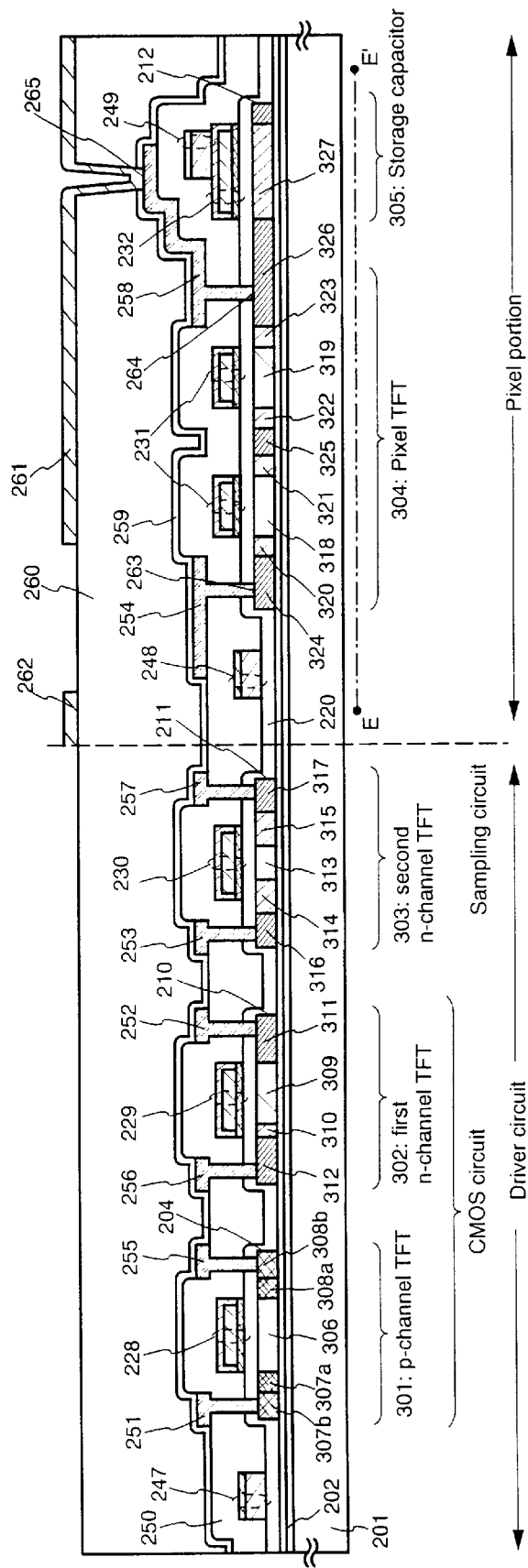

METHOD OF FABRICATING A SEMICONDUCTOR DEVICE

BACKGROUND OF THE INVENTION

1. Field of the Invention

The present invention relates to a method of forming a semiconductor film having a crystal structure, on a substrate having an insulating surface, and also to a method of fabricating a semiconductor device which employs the semiconductor film as an active layer. More particularly, it relates to a method of fabricating a thin film transistor in which an active layer is formed of a crystalline semiconductor film. Incidentally, here in this specification, the expression "semiconductor device" is intended to signify general devices which can function by utilizing semiconductor properties, and it shall cover within its category, an electro-optical device which is represented by a liquid crystal display device of active matrix type formed using thin film transistors, and an electronic equipment in which such an electro-optical device is installed as a component.

2. Description of the Related Art

There have been developed thin film transistors (hereinbelow, often abbreviated to "TFTs") each of which employs as its active layer a crystalline semiconductor film prepared in such a way that an amorphous semiconductor film is formed on an insulating substrate having a light transmissivity, such as of glass, and then crystallized by laser annealing, thermal annealing or the like. A glass substrate of barium borosilicate glass, alumino-borosilicate glass or the like is often employed as the insulating substrate. Although such a glass substrate is inferior to a quartz substrate in the point of a heat resistance, it is inexpensive on the market, and hence, it has the merit of being capable of the easy manufacture of a large area substrate.

The laser annealing is known as a crystallizing technique which can crystallize the amorphous semiconductor film by giving high energy on only this film without considerably raising the temperature of the glass substrate. In particular, an excimer laser which emits light of short wavelengths at a large power is considered most suited for this use. The laser annealing with the excimer laser is carried out in such a way that a laser beam is worked by an optical system so as to define a spot or a line on a surface to-be-irradiated, and that the surface to-be-irradiated is scanned by the worked laser beam (i. e., that the projected position of the laser beam is moved relatively to the surface to-be-irradiated). The excimer laser annealing with, for example, the rectilinear laser beam is also capable of laser-annealing the whole surface to-be-irradiated by the scanning in only a direction orthogonal to the longitudinal direction of the surface, and it is excellent in productivity. It is therefore becoming the mainstream as the manufacturing technology of a liquid crystal display device employing TFTs.

The laser annealing is applicable to the crystallization of various semiconductor materials. So far, however, a high field-effect mobility has been realized by employing a crystalline silicon film for the active layer of each TFT. The technology has incarnated a liquid crystal display device of monolithic type wherein pixel TFTs constituting pixel portions, and the TFTs of driver circuits to be disposed around the pixel portions are formed on a single glass substrate.

However, the crystalline silicon film prepared by the laser annealing has been formed in the shape of the aggregate of a plurality of crystal grains, and the locations and sizes of the crystal grains have been random. It has accordingly been impossible to form the crystalline silicon film with the locations and sizes of the crystal grains designated. The interfaces of the crystal grains (grain boundaries) have involved causes for degrading the current transport characteristics of carriers under the influences of recombination centers and trapping centers ascribable to amorphous structures, crystal defects etc., and potential levels at the grain boundaries. Nevertheless, it has been next to impossible that a channel forming region, in which the property of a crystal affects the characteristics of the TFT seriously, is formed of a single crystal grain with the influences of the grain boundaries excluded. Until today, therefore, the TFT which employs the crystalline silicon film as its active layer has not attained characteristics comparable to those of a MOS transistor which is fabricated on a single-crystal silicon substrate.

As a method for solving such a problem, it is considered an effective expedient to enlarge the crystal grains and to control the locations of the large crystal grains, thereby to eliminate the crystal grain boundaries from the channel forming region. By way of example, "Location Control of Large Grain Following Excimer-Laser Melting of Si Thin-Films", R. Ishihara and A. Burtsev, Japanese Journal of Applied Physics, vol. 37, No. 3B, pp. 1071–1075, 1988, discloses a method which realizes the location control of crystals and the enlargement of grains by controlling the temperature distribution of a silicon film in three dimensions. According to the method, a film of high-fusing metal is formed on a glass substrate, the metal film is overlaid with a silicon oxide film which partially differs in thickness, and an amorphous silicon film is formed on the surface of the silicon oxide film. It is reported that crystal grain diameters can be enlarged to several $\mu$m by irradiating both the surfaces of the resulting substrate with excimer laser beams.

The Ishihara et al. method features that the thermal characteristics of the base material of the amorphous silicon film are locally changed to control a heat flow to the substrate and to afford a temperature gradient. To that end, however, the three-layer structure of the high-fusing metal layer/silicon oxide layer/semiconductor film is formed on the glass substrate. It is structurally possible to fabricate a TFT of top gate type by employing the semiconductor film as an active layer. Since, however, a parasitic capacitance is incurred by the silicon oxide film interposed between the semiconductor film and the high-fusing metal layer, the power dissipation of the TFT increases, and the high-speed operation thereof is difficult of attainment.

On the other hand, the three-layer structure is considered to be effectively applicable to a TFT of bottom gate type or inverse stagger type by employing the high-fusing metal layer as a gate electrode. In the three-layer structure, however, even when the thickness of the semiconductor film is excluded, the total thickness of the high-fusing metal layer and the silicon oxide layer is problematic. More specifically, since a thickness suitable for the crystallizing process does not always agree with a thickness suitable for the characteristics of the TFT element, both the optimum design of the structure for the crystallizing process and the optimum design thereof for the element characteristics cannot be satisfied simultaneously.

Besides, when the high-fusing metal layer having no light transmissivity is formed on the whole surface of the glass substrate, a liquid crystal display device of transmission type cannot be fabricated. The high-fusing metal layer is useful in the point of a high thermal conductivity. Since, however, a chromium (Cr) film or titanium (Ti) film used as the high-fusing metal material exhibits a high internal stress, a problem will occur as to the close adhesion of the metal film with the glass substrate at a high possibility. Further, the internal stress may possibly exert influence even on the semiconductor film overlying the metal film and act as a force distorting the crystalline semiconductor film formed.

Meanwhile, for the purpose of controlling into a predetermined range a threshold voltage (hereinbelow, denoted as "Vth") which is an important characteristic parameter for the TFT, it has been required besides the control of the valence electrons of the channel forming region, to lower the charged defect densities of the base film and a gate insulating film which are respectively formed of insulating films in close touch with the active layer, and to consider the balance between the internal stresses of both the films. A material containing silicon as a constituent element, such as the silicon oxide film or a silicon oxynitride film, has been suitable for such requirements. Accordingly, the formation of the high-fusing metal layer for affording the temperature gradient is apprehended to collapse the aforementioned balance.

SUMMARY OF THE INVENTION

The present invention consists in techniques for solving the problems as stated above, and it has for its object to prepare a crystalline semiconductor film in which the location and size of a crystal grain are controlled, and to realize a TFT capable of high-speed operation by employing the crystalline semiconductor film as the channel forming region of the TFT. A further object of the present invention is to provide techniques by which such TFTs can be applied to various semiconductor devices of transmission type including a liquid crystal display device, an image sensor, etc.

Expedients for solving the problems will be described in conjunction with FIGS. 1A and 1B. Referring to FIG. 1A, a substrate 901 is overlaid with base films 902a, 902b, a semiconductor layer 903, a first protective insulating layer 904 and a thermal conduction layer 905. An insulating film, such as silicon oxide film or silicon oxynitride film, is well suited to each of the base films 902a, 902b. A light-transmissive material is employed for the thermal conduction layer 905. An amorphous semiconductor film, or a crystalline semiconductor film having a crystal structure is applicable to the semiconductor layer 903. Herein, the processing step of crystallization should most preferably be carried out by laser annealing. Especially, when an excimer laser emitting a laser beam at wavelengths of 400 nm or less is used as a light source, the semiconductor film can be preferentially heated, and hence, the use of the excimer laser is appropriate. A pulsed lasing type or a continuous emission type can be employed for the excimer laser. The light beam to irradiate the semiconductor layer 903 can be defined by an optical system into a rectilinear beam, a spot-like beam, a planar beam, etc., and the shape thereof is not restricted. Concrete conditions for the laser annealing shall be properly determined by a person who controls the processing step. It is to be understood that, at the crystallizing step in the present invention, the crystallization is effected by a melting—solid phase reaction as will be outlined below.

With the laser annealing, the semiconductor film is heated and molten by optimizing the conditions of the irradiating laser light (or laser beam), so as to control the creation density of crystal nuclei and crystal growth from the crystal nuclei. In FIG. 1A, the semiconductor layer 903 is considered to be divided into parts 903a and 903b as indicated by broken lines. A region A in which the semiconductor layer 903a exists is a region in which the thermal conduction layer 905 is disposed, while a region B which corresponds to the semiconductor layer 903b is the remaining region which surrounds the region A. With the laser annealing in the present invention, both the region A and the region B are simultaneously irradiated with the laser beam. The pulse width of the excimer laser is from several nsec to several tens nsec, for example, 30 nsec. Therefore, when the frequency of pulsed lasing is set at 30 Hz for the irradiation, the semiconductor layers of the irradiated regions are heated by the pulsed laser beam for an instant, and they are cooled for a time which is much longer than the heating time. The semiconductor layers are brought into molten states by the irradiation with the laser beam. Immediately after the irradiation with the laser beam has ended, heat begins to diffuse toward both the side of the substrate 901 and the side of the first protective insulating layer 904, and the semiconductor layers are cooled to solidify gradually. The diffusion coefficient of heat differs depending upon substances. Whereas the thermal diffusion coefficient of a silicon oxide film is 0.04 $cm^2$/sec, that of aluminum nitride employed for the thermal conduction layer 905 by way of example is 0.134 $cm^2$/sec. In addition, the thermal diffusion coefficient of the air is 0.001 $cm^2$/sec. Accordingly, the region A formed with the thermal conduction layer 905 is cooled quickly relatively to the region B.

The crystal nuclei are considered to be created and formed in the cooling process subsequent to the molten state. The creation density of the nuclei correlates with the temperature and cooling rate of the molten state. In this regard, it has been obtained as empirical knowledge that, when the high temperature is abruptly lowered, the nucleus creation density tends to heighten. Besides, in the process in which the molten state changes into a solid phase state, crystals grow from the crystal nuclei. In the case where the nucleus creation density is high, the crystal growth takes place from the individual crystal nuclei, and it stops at positions at which the grown ends of the crystals lie one upon another, whereby crystal grains and grain boundaries are formed. At the grain boundaries, an atomic arrangement is not kept orderly, and a large number of defect levels are formed. In such crystal growth, in the case of the high nucleus creation density, the crystals affect one another, and hence, only small crystal grains are formed. It is accordingly understood that the nucleus creation density needs to be lowered for forming large crystal grains.

In FIG. 1A, the crystal nuclei are created in the region A cooled from the molten state more abruptly, earlier than in the region B. Herein, the number of crystal nuclei to be created can be controlled to one by optimizing the area of the region A. Besides, the crystal growth from the crystal nucleus existing in the region A is preferentially done, whereby lateral crystal growth toward the region B proceeds in the subsequent cooling process. It is consequently permitted to enlarge one crystal grain around the region A.

The step of crystallization is not restricted to the laser annealing only, but thermal annealing and the laser annealing may well be combined therefor. By way of example, a crystalline semiconductor film can also be formed by first crystallizing an amorphous semiconductor film with the thermal annealing and thereafter irradiating the crystallized semiconductor film with a laser beam. A crystallizing method which employs a catalytic element may well be applied to the thermal annealing.

Defect levels at a density of $10^{16} \sim 10^{18}/cm^3$ remain in the semiconductor film prepared in this way. It is therefore recommended to perform the processing step of hydrogenation by heat-treating the semiconductor film at a temperature of 300~450° C. in a hydrogen atmosphere, a nitrogen atmosphere containing 1~3% of hydrogen, or an atmosphere containing hydrogen produced by forming a plasma. Owing to the hydrogenating step, the semiconductor film is doped with hydrogen on the order of 0.01~0.1 atomic %, and the defect level density can be lowered.

FIG. 1B shows a structure in which a substrate 901 is overlaid with a second protective insulating layer 906, in addition to base films 902a, 902b, a semiconductor layer 903, a first protective insulating layer 904 and a thermal conduction layer 905. The mechanism of crystal growth is similar to that explained with reference to FIG. 1A. The second protective insulating layer 906 is provided in order to control a cooling rate in a region B and to endow the region B with a thermal capacity.

At the crystallizing step as explained above, the thermal conductivities and thicknesses of materials to be used for the thermal conduction layer 905, the base films 902a, 902b, the first protective insulating layer 904 and the second protective insulating layer 906 are choices important for the purpose of controlling transient phenomena in the cooling of the semiconductor layer 903. The thermal conduction layer 905 needs to be made of a material whose thermal conductivity at the normal temperature is 10 $Wm^{-1}K^{-1}$ or more. As such a material, it is possible to apply a material which contains one or more members selected from the group consisting of aluminum oxide, aluminum nitride, oxidized aluminum nitride, silicon nitride and boron nitride. Alternatively, it is allowed to apply a compound which contains Si, N, O and M (where letter M denotes at least one member selected from the group consisting of Al and a rare-earth element).

On the other hand, the base films 902a, 902b, the first protective insulating layer 904 and the second protective insulating layer 906 are made of materials whose thermal conductivities at the normal temperature are lower than 10 $Wm^{-1}K^{-1}$. An silicon oxynitride film should desirably be employed because of a material which has such a thermal conductivity, and which is suitable as the base layer of a TFT to be formed on a glass substrate. Of course, it is also possible to employ another material such as a silicon nitride film or a silicon oxide film. As the most preferable material, however, the first insulating film 902a or the second insulating film 902b may be formed of an silicon oxynitride film which is prepared from $SiH_4$ and $N_2O$ by plasma CVD, and whose composition is set at an oxygen concentration from 55 to 70 atomic % and a nitrogen concentration from 1 to 20 atomic %.

The thermal conduction layer 905 is formed in an insular shape in conformity with the arrangement of the active layer of the TFT (the semiconductor film in which a channel forming region, a source region, a drain region and an LDD region are formed). Although the size of the thermal conduction layer 905 is set in conformity with, for example, the size of the TFT, it may be set at 0.1~10 $\mu m^2$ or so. The thermal conduction layer 905 is formed considering, at least, the position and size of the channel forming region of the TFT, whereby the channel forming region can be formed of the single crystal grain of the crystalline semiconductor film. That is, a semiconductor device according to the present invention can be endowed with a structure comparable to one in which the channel forming region is substantially made of a single-crystal film. Besides, when the thermal conduction layer 905 is removed after the crystallization by the laser annealing, the TFT or the like can be completed without any influence thenceforth.

BRIEF DESCRIPTION OF THE DRAWINGS

FIGS. 2A to 2E are sectional views showing a process for preparing a crystalline semiconductor film according to the present invention;

FIGS. 9A to 9D are sectional views showing a process for fabricating the pixel TFTs of a pixel portion and the TFTs of a driver circuit;

FIGS. 11A to 11D are sectional views showing the process for fabricating the pixel TFTs and the TFTs of the driver circuit;

FIGS. 12A to 12C are sectional views showing the process for fabricating the pixel TFTs and the TFTs of the driver circuit;

FIG. 13 is a sectional view showing the pixel TFTs and the TFTs of the driver circuit;

DETAILED DESCRIPTION OF THE INVENTION

Embodiment 1

Figure 1A:
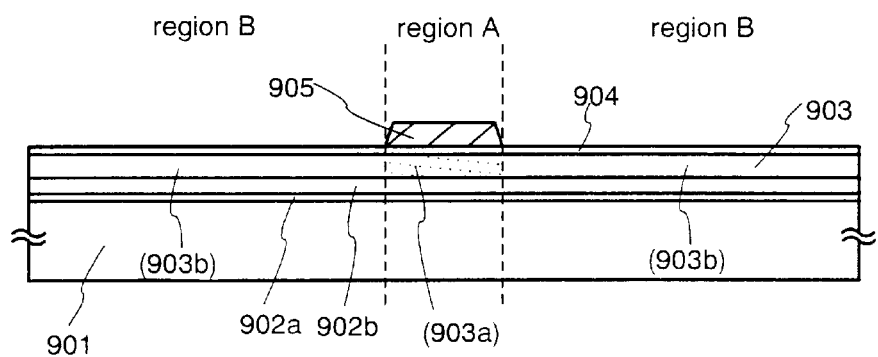
FIGS. 1A and 1B are sectional views for elucidating the constructions of the present invention.
Figure 1B:
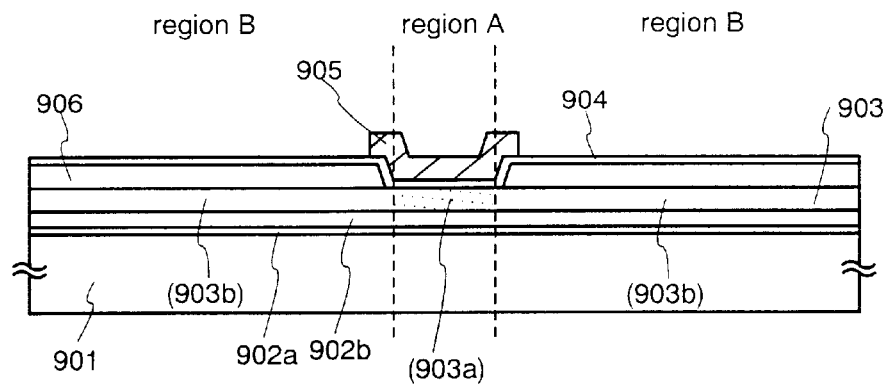

An embodiment of the present invention will be described with reference to FIGS. 2A to 2E. Referring to FIG. 2A, a glass substrate of no alkali concentration, such as of barium borosilicate glass or alumino-borosilicate glass, is employed as a substrate 501. By way of example, a substrate of Glass #7059 or Glass #1737 manufactured by Corning Incorporated can be appropriately employed. When such a glass substrate is previously heat-treated at a temperature being about 10~20° C. lower than the strain point of the glass, the deformation of the substrate attributed to the shrinkage thereof can be relieved at later steps.

Base films 502a, 502b made of insulating films are formed on that surface of the substrate 501 over which TFTs are to be fabricated. A material whose thermal conductivity is lower than 10 $Wm^{-1}K^{-1}$, is employed for the base films 502a, 502b. As such a material, any of a silicon oxide film, a silicon nitride film, etc. can be selected, and a silicon oxynitride film should preferably be employed for the purpose of preventing the diffusion of any impurity from the glass substrate 501 and in consideration of the balance of internal stresses. For example, the base film 502a made of the insulating film is formed to a thickness of 10~100 nm (preferably, 50 nm) by a silicon oxynitride film prepared from $SiH_4$, $N_2O$ and $NH_3$, while the base film 502b is formed to a thickness of 50~500 nm (preferably, 100 nm) by a silicon oxynitride film prepared from $SiH_4$ and $N_2O$. On this occasion, the silicon oxynitride film of the base film 502a has its oxygen concentration set to be from 20 to 30 atomic % and also has its nitrogen concentration set to be from 20 to 30 atomic %. On the other hand, the silicon oxynitride film of the base film 502b has its oxygen concentration set to be from 55 to 70 atomic % and has its nitrogen concentration set to be from 1 to 20 atomic %. With such compositions, the internal stresses of the silicon oxynitride films are made appropriate, and the fixed charge densities thereof are lowered.

Subsequently, a semiconductor layer 503 having an amorphous structure is formed to a thickness of 25~80 nm (preferably, 30~60 nm) by a known process such as plasma CVD or sputtering. In an example of this embodiment, an amorphous silicon film was formed to a thickness of 55 nm by the plasma CVD. An amorphous semiconductor film or a microcrystal semiconductor film is mentioned as the semiconductor film having the amorphous structure, and a compound semiconductor film having the amorphous structure, such as amorphous silicon germanium film, may well be applied.

A first protective insulating layer 504 is formed on the semiconductor layer 503. The layer 504 is disposed for the purposes of preventing the direct touch of a thermal conduction layer with the semiconductor layer 503 and controlling the diffusion of heat from the semiconductor layer 503 during laser annealing. Besides, considering the wavelengths of the light of an excimer laser employed for the laser annealing, the first protective insulating layer 504 should preferably be made of a material having a band gap of 5 eV or more, for the purpose of causing the laser beam to effectively enter the semiconductor layer 503. In addition, the layer 504 needs to be formed at a thickness of 10~200 nm for the purpose of establishing a reflectionless condition. In order to meet such purposes, the first protective insulating layer 504 may be formed of a silicon oxide film, a silicon oxynitride film, or the like.

The surface of the protective insulating film 504 is overlaid with the thermal conduction layer 505 whose band gap is 5 eV, which has a light transmissivity and whose thermal conductivity is excellent. The thickness of the thermal conduction layer 505 is set at 50~500 nm, and it should preferably be one establishing a reflectionless condition for the irradiating laser beam, by taking also the thickness of the first protective insulating layer 504 into consideration. Besides, in order to efficiently radiate the heat from the semiconductor layer 503, the thermal conductivity needs to be 10 $Wm^{-1}K^{-1}$ or more. As a material fulfilling such requirements, the oxide of aluminum (aluminum oxide ($Al_2O_3$)) is suitable because of being light-transmissive for the visible radiation and exhibiting a thermal conductivity of 20 $Wm^{-1}K^{-1}$. In addition, the aluminum oxide is not restricted to the stoichiometric ratio, but it may well be doped with another element in order to control the thermal conductivity characteristics and such characteristics as internal stresses. By way of example, oxidized aluminum nitride ($AlN_xO_{1-x}$: $0.02 \leq x \leq 0.5$) may well be employed by doping the aluminum oxide with nitrogen, and the nitride of aluminum ($AlN_x$) can also be employed. Moreover, it is possible to employ a compound which contains silicon (Si), oxygen (O), nitrogen (N) and M (where letter M denotes at least one element selected from the group consisting of aluminum (Al) and a rare-earth element). By way of example, AlSiON or LaSiON can be appropriately employed. Further, boron nitride or the like can be applied.

Thereafter, as shown in FIG. 2B, the thermal conduction layer 505 is etched into insular shapes, thereby to form thermal conduction layers 506. By way of example, in a case where the thermal conduction layer 505 is made of aluminum nitride, the insular thermal conduction layers 506 can be formed in such a way that a resist mask is deposited in a predetermined shape on the thermal conduction layer 505 by the technique of photolithography, whereupon the thermal conduction layer 505 is subjected to an etching process with a heated solution of phosphoric acid. Each of the insular thermal conduction layers 506 is formed into an area of about 0.1~10$\mu m^2$.

Figure 22:
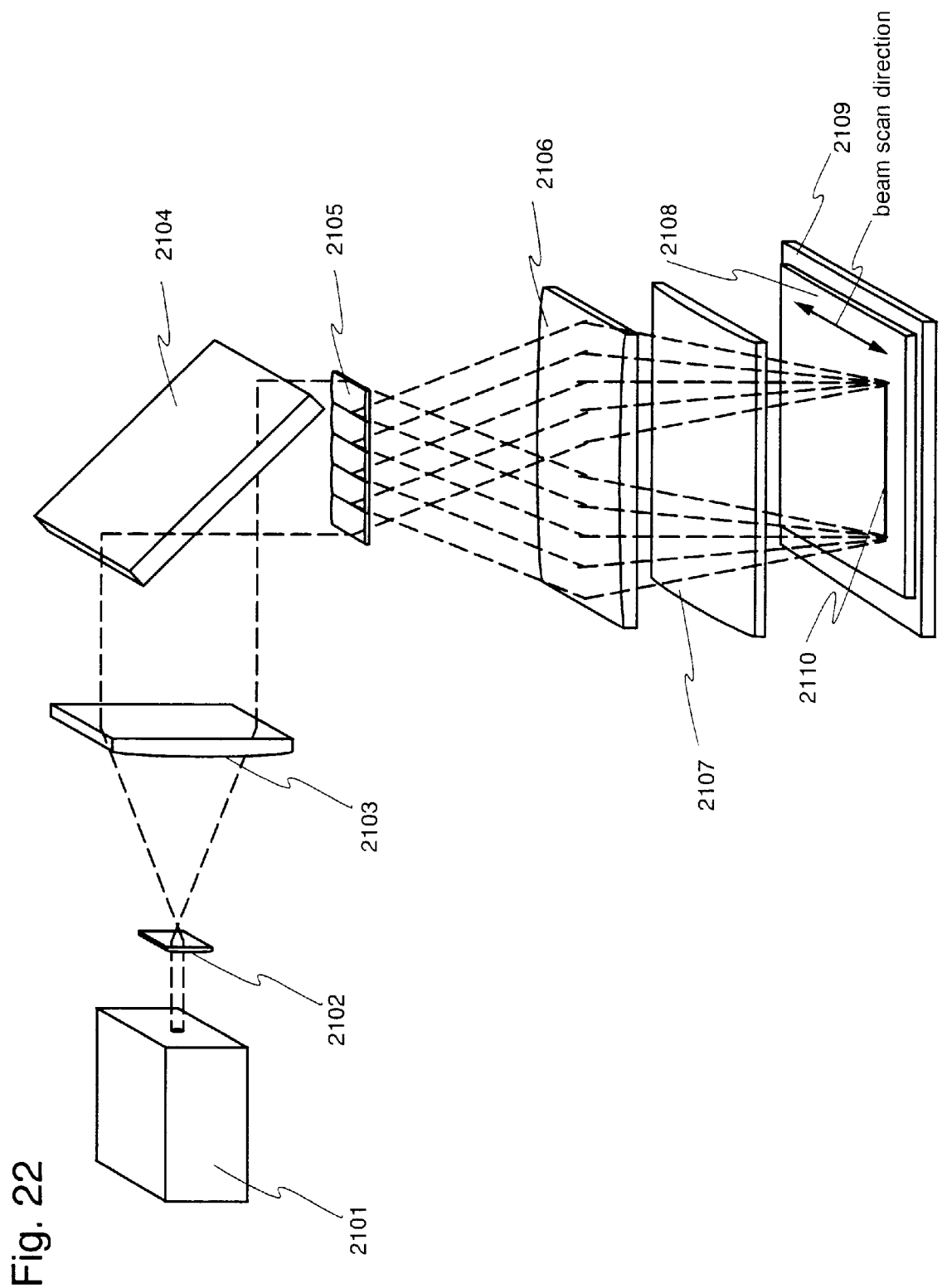
FIG. 22 is a schematic arrangement view showing the construction of a laser annealing apparatus.

Crystallization is carried out by the laser annealing as shown in FIG. 2C. At the processing step of crystallization, hydrogen contained in the amorphous semiconductor film 503 should desirably be first emitted, and the structure shown in FIG. 2B may be heat-treated at 400~500° C. for about one hour so as to diminish the hydrogen concentration to 5 atomic % or less. The laser annealing employs the excimer laser or an argon laser of pulsed lasing type or continuous emission type as its light source. FIG. 22 is a diagram showing the construction of such a laser annealing apparatus. The excimer laser, the argon laser or the like is applied to a laser beam generator 2101. A laser beam emergent from the laser beam generator 2101 is expanded in one direction by beam expanders 2102, 2103. The laser beam reflected by a mirror 2104 is split by a cylindrical lens array 2105, and the resulting beam is turned into a rectilinear beam having a line width of 100~1000$\mu$m, by cylindrical lenses 2106, 2107. The rectilinear beam irradiates the surface of a sample so as to define an irradiated region 2110. A substrate 2108 is held on a stage 2109 which is movable in an X-direction, a Y-direction and a Θ-direction. Herein, the laser annealing can be performed over the whole surface of the substrate 2108 by moving the stage 2109 relatively to the irradiated region 2110. On this occasion, the crystallization may be done by holding the substrate 2108 in the atmospheric air. Alternatively, a reaction chamber as shown in FIG. 23 may well be disposed so as to hold the substrate 2108 under a reduced pressure or in an inert gas atmosphere.

Figure 23:
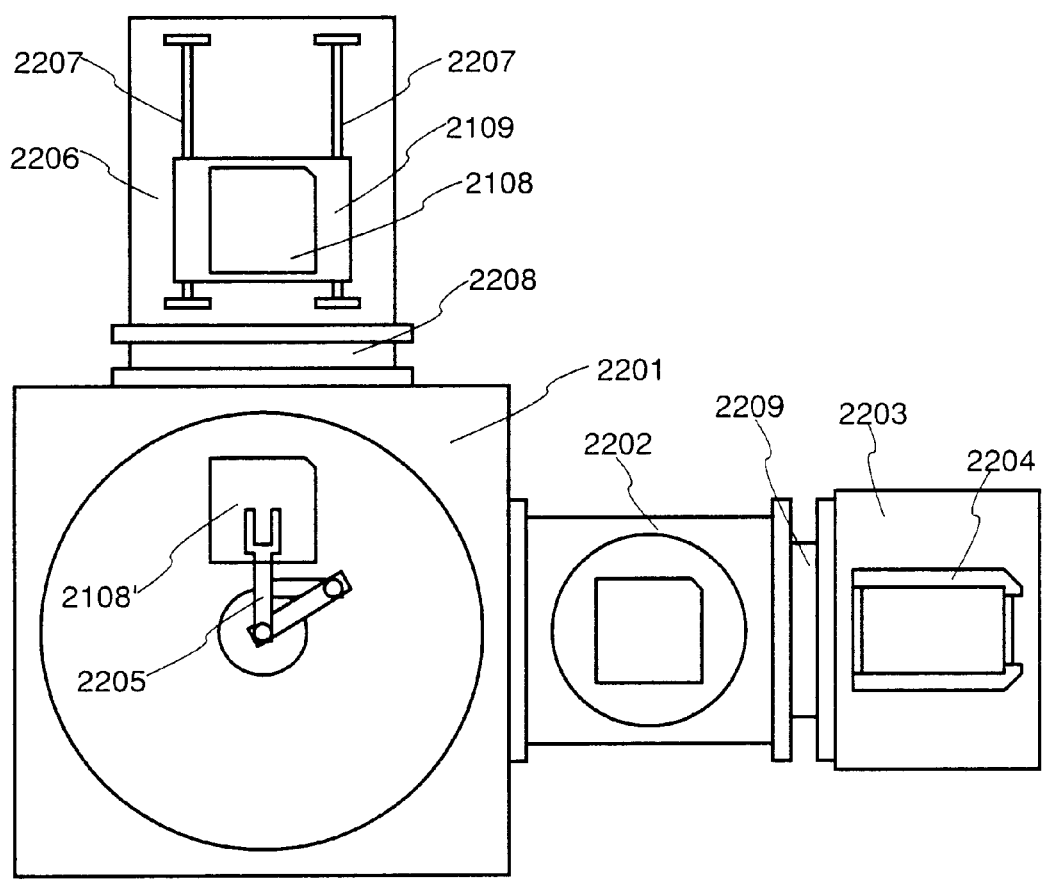
FIG. 23 is a schematic plan view showing the construction of a reaction chamber in the laser annealing apparatus.

FIG. 23 is a schematic plan view for explaining one aspect of performance concerning a substrate holding method in the laser annealing apparatus shown in FIG. 22. The substrate 2108 held on the stage 2109 is set in the reaction chamber 2206. The interior of the reaction chamber 2206 can be brought into the reduced pressure state or the inert gas atmosphere by an evacuation system or a gas system, not shown. The stage 2109 can move along guide rails 2207 within the reaction chamber 2206. The laser beam enters the reaction chamber 2206 through a quartz-made window, not shown, which is provided over the substrate 2108. With such a construction, the substrate 2108 can be heated to 300~500° C. by heating means (not shown) disposed in the stage 2109. Besides, in the example of FIG. 23, a transfer chamber 2201, an intermediate chamber 2202 and a load/unload chamber 2203 are connected to the reaction chamber 2206 in succession, and they are partitioned by gate valves 2208, 2209. A cassette 2204 capable of holding a plurality of substrates is mounted in the load/unload chamber 2203, and the substrates are transported by a transport robot 2205 mounted in the transfer chamber 2201. Reference numeral 2108 denotes the substrate under the transport. Owing to such a construction, the substrates can be successively subjected to the laser annealing process under the reduced pressure or in the inert gas atmosphere.

The conditions of the laser annealing shall be properly selected by a person in charge. By way of example, a rectilinear beam 507 (in FIG. 2C) having a line width of 100~1000 $\mu$m, e. g., a line width of 400 $\mu$m is projected by setting the pulsed lasing frequency of the excimer laser at 30 Hz and the energy density thereof at 100~500 mJ/cm$^2$ (typically at 300~400 mJ/cm$^2$). Since the line width is larger than each insular thermal conduction layer 506, the amorphous silicon layer 503 on the first insulating film (base films 502a, 502b) can be crystallized even by the irradiation with the rectilinear beam of one pulse. Alternatively, the amorphous silicon layer 503 may well be irradiated a plurality of times while the substrate 2108 is being scanned with the rectilinear beam. On this occasion, the overlap ratio of areas scanned by the rectilinear beam may be set at 50~98%. Even when the shape of the laser beam is planar, the substrate 2108 can be similarly processed.

Figure 7:
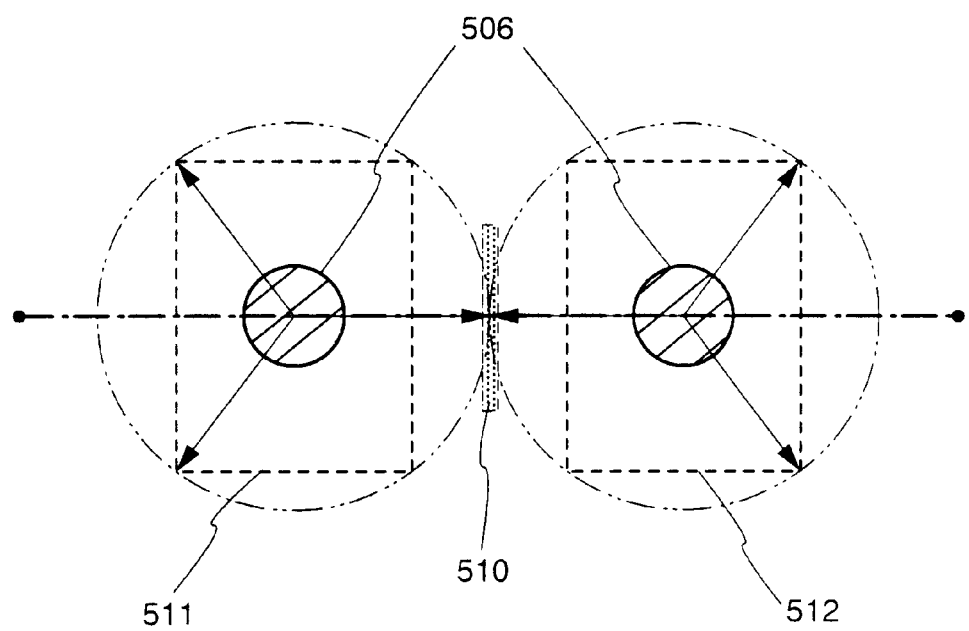
FIG. 7 is a top plan view for explaining the positional relationship among thermal conduction layers, a grain boundary and insular semiconductor films.

In the case where the pulsed lasing frequency of the excimer laser is set at 30 Hz, the pulse width thereof is several nsec (nanoseconds) ~several tens nsec, for example, about 30 nsec. Therefore, when the amorphous silicon film 503 is irradiated with the rectilinear laser beam of pulsed shape, it is heated in an instant, and it is thereafter cooled for a time period which is much longer than the heating time. Herein, the semiconductor layer 503 is divided into semiconductor layers 508 in regions where the thermal conduction layers 506 are formed, and semiconductor layers 509 in the other regions. For the sake of convenience, the former regions shall be called the "regions A", and the latter regions the "regions B". Then, on this occasion, as illustrated in FIG. 2D, the regions A have heat diffused quickly into the thermal conduction layers 506 and are therefore cooled rapidly in comparison with the regions B. Crystal nuclei are created earlier in the regions A abruptly cooled from molten states, than in the regions B. Besides, crystal growth from the crystal nuclei existing in the regions A is preferentially done, whereby lateral crystal growth toward the regions B proceeds in the subsequent cooling process, and crystal grains can be enlarged around the regions A. Herein, the number of crystal nuclei to be created in each region A can be controlled to one by optimizing the area of the region A. In due course, crystal grain boundaries 510 are formed at the grown ends of the crystal growth. FIG. 7 is a top plan view corresponding to FIG. 2D. It illustrates the situation where the crystallization proceeds around the thermal conduction layers 506, and where the grain boundary 510 is formed at the grown ends of crystals.

Thereafter, a photoresist pattern is formed on the resulting crystalline semiconductor films, and insular semiconductor films 511, 512 are formed by dry etching. On this occasion, as also shown in FIG. 7, the grain boundary 510 should preferably be removed so as not to remain in the insular semiconductor films 511, 512. A mixed gas consisting of $CF_4$ and $O_2$ is employed for the dry etching. Defect levels at a density of $10^{16}$~$10^{18}$/cm$^3$ remain in the insular semiconductor films 511, 512 prepared in this way. It is therefore recommended to perform the processing step of hydrogenation by heat-treating the resulting substrate structure at a temperature of 300~450° C. in a hydrogen atmosphere, a nitrogen atmosphere containing 1~3% of hydrogen, or an atmosphere containing hydrogen produced by forming a plasma. Owing to the hydrogenating step, the insular semiconductor films 511, 512 are doped with hydrogen on the order of 0.01~0.1 atomic %. Thus, each of the insular semiconductor films 511, 512 is formed of one crystal grain, which is substantially equivalent to a single crystal. Therefore, when an element such as TFT is fabricated at the part of each insular semiconductor film, characteristics corresponding to those of a MOS transistor fabricated on a single-crystal silicon substrate can be attained.

Embodiment 2

Figure 3A:
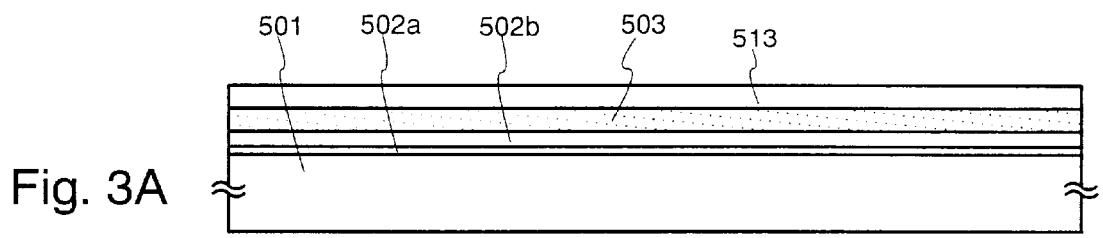
FIGS. 3A to 3E are sectional views showing a process for preparing a crystalline semiconductor film according to the present invention.

Another embodiment of the present invention will be described with reference to FIGS. 3A to 3E. Referring to FIG. 3A, in the same manner as in Embodiment 1, base films 502a, 502b and a semiconductor layer 503 are formed on a substrate 501. Besides, a second protective insulating layer 513 is formed on the resulting structure to a thickness of 50~300 nm by employing a silicon oxide film, a silicon oxynitride film or the like. The second protective insulating layer 513 is disposed for the purpose of controlling the diffusion of heat from the semiconductor layer 503, and it is provided separately from the protective insulating film 504 shown in FIG. 2A. Thus, the control of the diffusion rate of the heat can be facilitated more by changing the thickness of the layer 513.

Figure 3B:
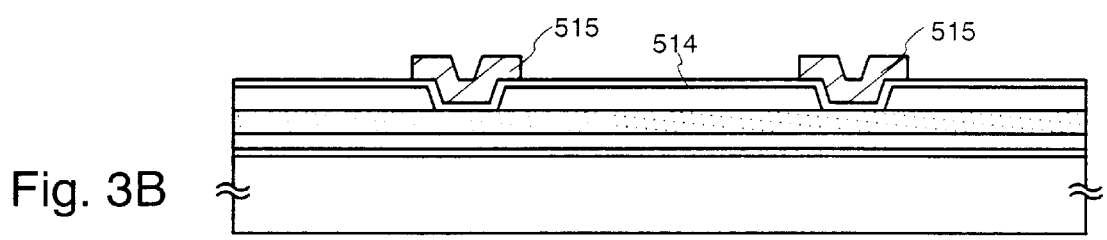

Subsequently, as seen from FIG. 3B, openings are formed in the predetermined positions of the second protective insulating layer 513. The silicon oxide film, the silicon oxynitride film or the like can be etched at a good selectivity with respect to the underlying semiconductor layer 503 by an acid solution which contains hydrofluoric acid. Thereafter, in the same manner as in Embodiment 1, a first protective insulating layer 514 is formed on the whole surface of the resulting layer 513, and thermal conduction layers 515 are patterned and formed.

Figure 3C:
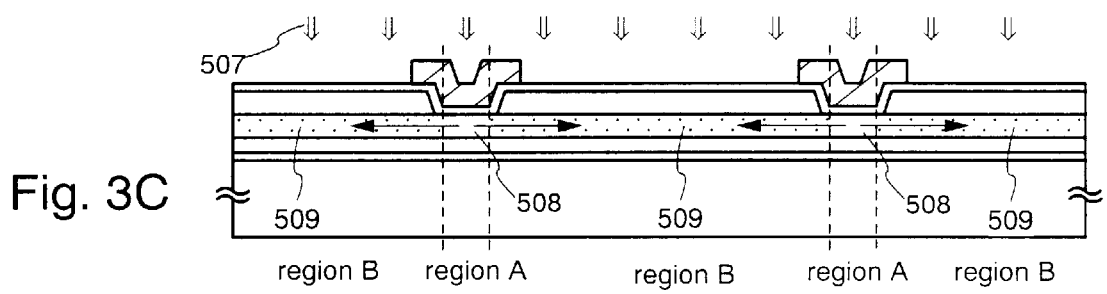
Figure 3D:
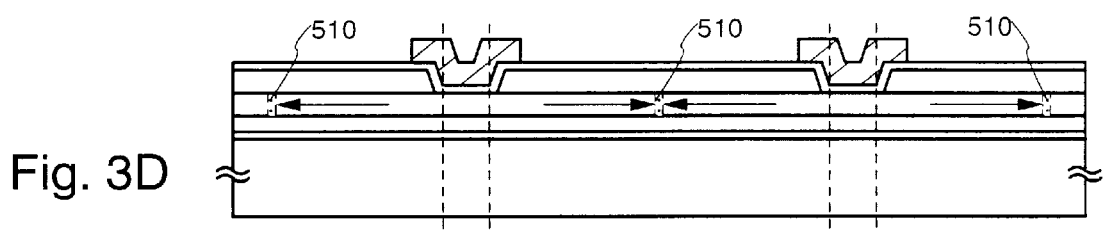
Figure 3E:
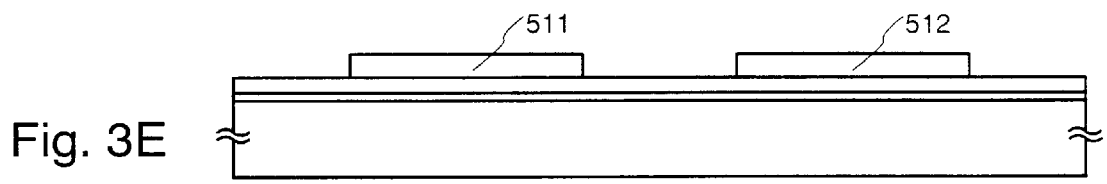

The crystallization of the semiconductor layer 503 should most preferably be done by laser annealing, and it may be performed in the same way as in Embodiment 1. In the structure of FIG. 3C, the cooling rate of regions B becomes slower than in the structure of FIG. 2C in a cooling process subsequent to the projection of a pulsed laser beam 507. Therefore, it can be more easily realized to enlarge crystal grains. A semiconductor layer in which the locations of the crystal grains are controlled, can be obtained in this way. Also in this case, however, crystal grain boundaries 510 are formed at the grown ends of crystals created from regions A, as shown in FIG. 3D.

Thereafter, a photoresist pattern is formed on the resulting crystalline semiconductor films, and insular semiconductor films 511, 512 (in FIG. 3E) are formed by dry etching. On this occasion, the insular semiconductor films 511, 512 should desirably be formed with the grain boundaries 510 removed. Defect levels at a density of $10^{16}$~$10^{18}$/cm$^3$ remain in the insular semiconductor films 511, 512 prepared in this way. It is therefore recommended to perform the processing step of hydrogenation by heat-treating the resulting substrate structure at a temperature of 300~450° C. in a hydrogen atmosphere, a nitrogen atmosphere containing 1~3% of hydrogen, or an atmosphere containing hydrogen produced by forming a plasma. Owing to the hydrogenating step, the insular semiconductor films 511, 512 are doped with hydrogen on the order of 0.01~0.1 atomic %.

Embodiment 3

The semiconductor layer 503 shown in FIG. 2A or FIG. 3A is not restricted to the amorphous semiconductor film, but it may well be formed of a crystalline semiconductor film. By way of example, it is also allowed to apply the crystalline semiconductor film obtained in such a way that an amorphous semiconductor film is crystallized by thermal annealing beforehand. In this embodiment, there will be mentioned an example in which the thermal annealing is combined with a crystallizing method employing a catalytic element as disclosed in the official gazette of Japanese Patent Application Laid-Open No. 7-130652.

Figure 4A:
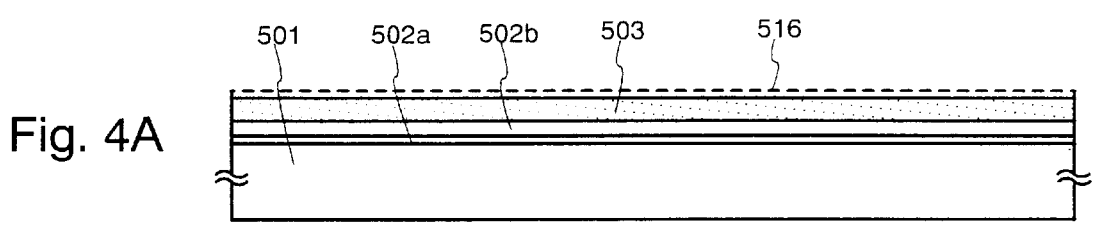
FIGS. 4A to 4C are sectional views showing a process for preparing a crystalline semiconductor film according to the present invention.

As shown in FIG. 4A, in the same manner as in Embodiment 1, base films 502a, 502b made of insulating films, and a semiconductor layer 503 made of an amorphous semiconductor film having a thickness of 25~80 nm are formed on a glass substrate 501. By way of example, an amorphous silicon film is formed to a thickness of 55 nm. Besides, the semiconductor layer 503 is coated with an aqueous solution containing a catalytic element at 10 ppm in terms of weight, by spin coating, thereby to form a layer 516 which contains the catalytic element. Examples of the catalytic element are nickel (Ni), germanium (Ge), iron (Fe), palladium (Pd), tin (Sn), lead (Pb), cobalt (Co), platinum (Pt), copper (Cu) and gold (Au). The layer 516 containing the catalytic element may well be formed to a thickness of 1~5 nm by sputtering or vacuum evaporation alternatively to the spin coating.

Figure 4B:
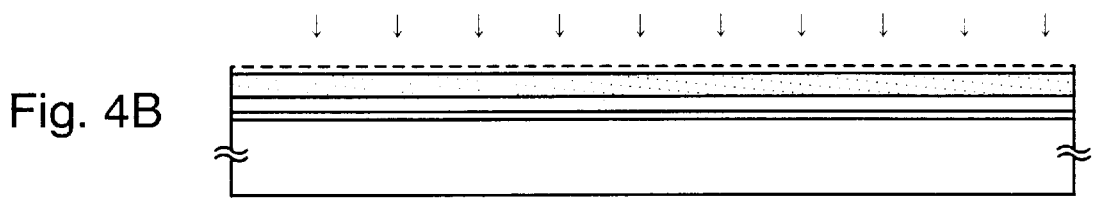

In a process for crystallization as shown in FIG. 4B, the resulting substrate structure is first heat-treated at 400~500° C. for about one hour, thereby to bring the hydrogen concentration of the amorphous silicon film 503 to 5 atomic % or less. Subsequently, the structure is subjected to the thermal annealing at 550~600° C. in a nitrogen atmosphere for 1~8 hours by employing an annealing furnace. A semiconductor layer 503b made of a crystalline silicon film can be obtained by the above processing steps (in FIG. 4C). However, when the crystalline semiconductor film 503b prepared in accordance with the thermal annealing by the steps thus far explained is microscopically observed with a transmission electron microscope or the like, it consists of a plurality of crystal grains, and the sizes and arrangement of the crystal grains are not uniform, but they are random. Moreover, when the crystalline semiconductor film 503b is macroscopically observed by Raman spectroscopy and with an optical microscope, it is sometimes noticed that amorphous regions are locally left behind.

Figure 4C:
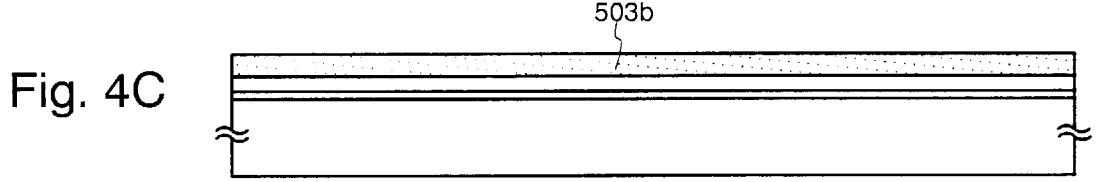

When the crystallizing method explained in Embodiment 1 or Embodiment 2 is applied thenceforth, a large-sized crystal grain can be obtained more easily. This is so interpreted that, when the laser annealing is applied to the semiconductor layer 503b obtained as shown in FIG. 4C, the crystalline semiconductor film 503b in which the catalytic element remains will be once brought into a molten state, followed by recrystallization. By way of example, a sample in the state of FIG. 4C is worked into the structure of FIG. 2C or FIG. 3C, and the emergent beam of XeCl excimer laser (at a wavelength of 308 nm) is defined into a rectilinear beam by an optical system. The worked structure is irradiated with the rectilinear beam under the conditions of a lasing frequency of 5~50 Hz, an energy density of 100~500 mJ/cm$^2$ and a scanning-beam overlap proportion of 80~98%. It is consequently possible to obtain crystalline semiconductor films in which crystal grains have their locations controlled and their sizes enlarged, unlike those of the crystalline semiconductor film 503b shown in FIG. 4C. When the crystalline semiconductor films subjected to the laser annealing are observed by the Raman spectroscopy and with the optical microscope, amorphous regions are no longer left behind.

However, defect levels on the order of $10^{16}$~$10^{18}$/cm$^3$ remain even in such crystalline semiconductor films. It is therefore recommended to perform the processing step of hydrogenation by heat-treating the resulting substrate structure at a temperature of 300~450° C. in a hydrogen atmosphere, a nitrogen atmosphere containing 1~3% of hydrogen, or an atmosphere containing hydrogen produced by forming a plasma. Owing to the hydrogenating step, the insular semiconductor films 511, 512 are doped with hydrogen on the order of 0.01~0.1 atomic %.

Example 1

In this example, a process for fabricating a CMOS circuit which consists of an n-channel TFT and a p-channel TFT will be described with reference to FIGS. 5A to 5E and FIGS. 6A to 6E.

Figure 5A:
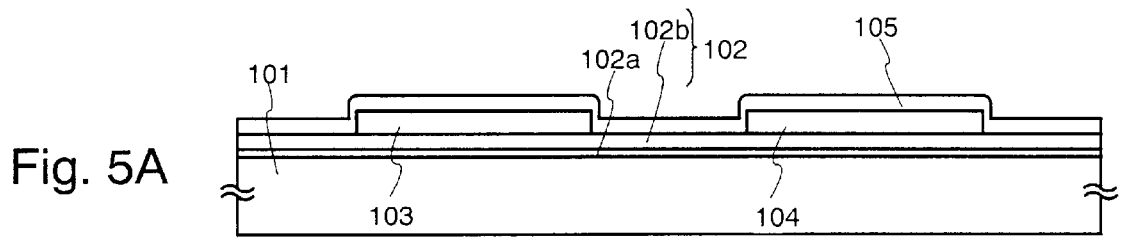
FIGS. 5A to 5E are sectional views showing a process for fabricating TFTs.

Referring to FIG. 5A, barium borosilicate glass, aluminoborosilicate glass or the like, represented by Glass #7059 or Glass #1737 of Corning Incorporated, is employed for a substrate 101. When such a glass substrate is previously heat-treated at a temperature being about 10~20° C. lower than the strain point of the glass, the deformation of the substrate attributed to the shrinkage thereof can be relieved at later steps. On that surface of the substrate 101 over which the TFTs are to be formed, a base film 102 made of insulating films is formed in order to prevent contamination with an alkaline metal element or any other impurity diffusing from the substrate 101. The base film 102 is formed of a silicon oxynitride film 102a prepared from SiH$_4$, NH$_3$ and N$_2$O by plasma CVD, and a hydrogenated silicon oxynitride film 102b prepared from SiH$_4$, N$_2$O and H$_2$. The silicon oxynitride film 102a is formed at a thickness of 10~100 nm (preferably, 20~60 nm), while the hydrogenated silicon oxynitride film 102b is formed at a thickness of 10~200 nm (preferably, 20~100 nm).

Besides, a crystalline semiconductor film (here, crystalline silicon film) is formed by the method explained in any of Embodiments 1~3, and it is subjected to an etching process, thereby to form insular semiconductor films 103, 104. In a present example, the etching process was carried out by dry etching, in which a mixed gas consisting of CF$_4$ and O$_2$ was employed. Each of the insular semiconductor films 103, 104 was made up of a single crystal grain, and each of these films patterned and formed by the etching could be substantially regarded as a single crystal. Thereafter, a mask layer 105 which is made of a silicon oxide film having a thickness of 50~100 nm is formed by plasma CVD, low-pressure CVD or sputtering. In the case of the plasma CVD by way of example, tetraethyl orthosilicate (TEOS) and O$_2$ are mixed, and electric discharge is induced under the conditions of a reaction pressure of 40 Pa, a substrate temperature of 300~400° C. and a radio-frequency (13.56 MHz) power density of 0.5~0.8 W/cm$^2$, thereby to form the mask layer 105 to a thickness of 100~150 nm, typically 130 nm.

Figure 5B:
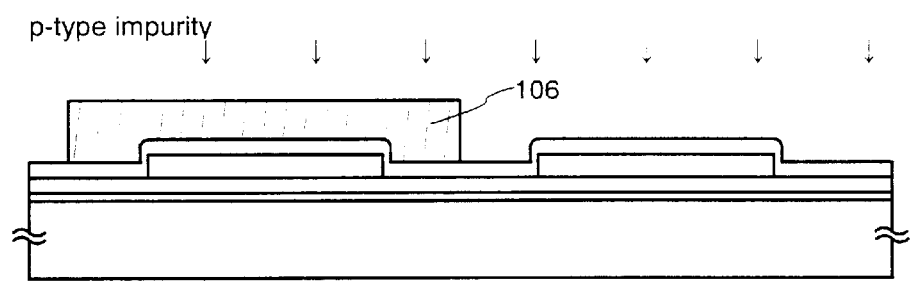

Subsequently, as shown in FIG. 5B, a resist mask 106 is provided, and the insular semiconductor film 104 for forming the n-channel TFT is doped with an impurity element for giving the p-type conductivity, at a concentration of about $1 \times 10^{16}$~$5 \times 10^{17}$ atoms/cm$^3$ in order to control the threshold voltage of the TFT. The elements of Group-13 of the periodic table, such as boron (B), aluminum (Al) and gallium (Ga), are known as the impurity elements which give the p-type conductivity on semiconductors. Here in the present example, diborane (B$_2$H$_6$) was used to dope the insular semiconductor film 104 with boron (B) by ion doping. The doping with boron (B) is not always necessary, but it may well be omitted. The semiconductor layer 104 doped with boron (B), however, functions effectively for the purpose of confining the threshold voltage of the n-channel TFT within a predetermined range. Of course, the step of the doping can be omitted according to the judgement of a person who designs the CMOS circuit. Besides, the whole surface of the substrate structure shown in FIG. 5A may well be doped with the impurity element giving the p-type conductivity, without providing the resist mask 106.

Figure 5C:
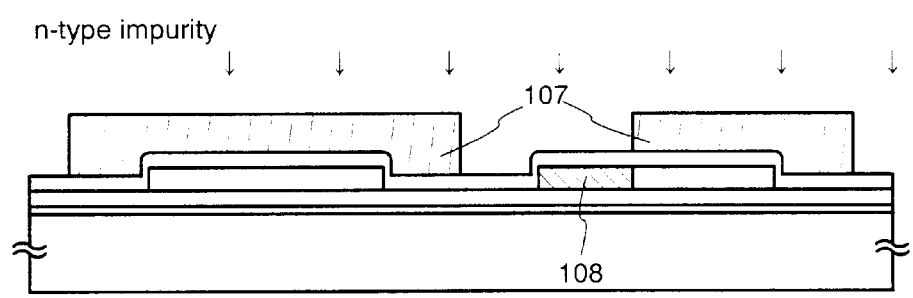

In order to form the LDD region of the n-channel TFT, the insular semiconductor film 104 is selectively doped with an impurity element for giving the n-type conductivity. The elements of Group-15 of the periodic table, such as phosphorus (P), arsenic (As) and antimony (Sb), are known as the impurity elements which give the n-type conductivity on semiconductors. A resist mask 107 is formed for the doping. Here in the present example, ion doping which employed phosphine (PH$_3$) was applied in order to selectively dope the insular semiconductor film 104 with phosphorus (P). The concentration of phosphorus (P) in an impurity region 108 to be formed is set within a range of $2 \times 10^{16}$~$5 \times 10^{19}$ atoms/cm$^3$ (FIG. 5C). By the way, in this specification, the concentration of the impurity element for giving the n-type conductivity, contained in the impurity region 108, shall be expressed as (n).

Subsequently, the mask layer 105 was removed using an etchant, such as hydrofluoric acid diluted with pure water, in the present example. In addition, the processing step of activating the impurity elements introduced into the insular semiconductor film 104 at the steps of FIGS. 5B and 5C is carried out. The activation can be effected by an expedient such as laser annealing, or thermal annealing for 1~4 hours at 500~600° C. in a nitrogen atmosphere. Alternatively, both the expedients may be used conjointly. In the present example, the expedient of the laser activation was employed. More specifically, the emergent beam of an excimer laser was defined into a rectilinear beam, and the whole surface of the substrate structure formed with the insular semiconductor films 103, 104 was irradiated with the rectilinear beam under the conditions of a lasing frequency of 5~50 Hz, an energy density of 100~500 mJ/cm$^2$ and a scanning-beam overlap proportion of 80~98%. Incidentally, the conditions for the irradiation with the laser beam are not especially restricted, but they may be properly determined by the person in charge.

Figure 5D:
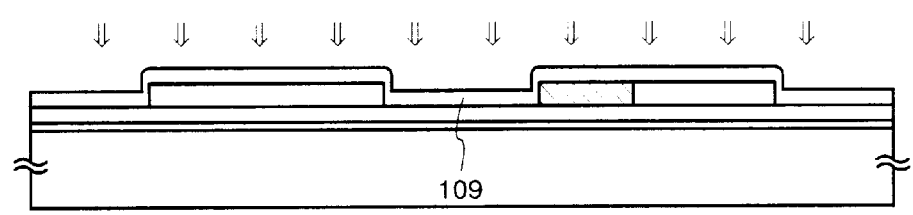

A gate insulating film 109 is formed of an insulating film containing silicon, at a thickness of 40~150 nm by employing plasma CVD or sputtering. By way of example, it may be formed of the same silicon oxynitride film as the first insulating film 102a at a thickness of 120 nm. Besides, a silicon oxynitride film prepared from SiH$_4$ and N$_2$O with O$_2$ added thereto is still better for the reason that the density of fixed charges in the film is lower. The gate insulating film 109 is not restricted to such a silicon oxynitride film, but it may well be formed of another insulating film containing silicon as a single layer or a stacked structure (FIG. 5D).

Figure 5E:
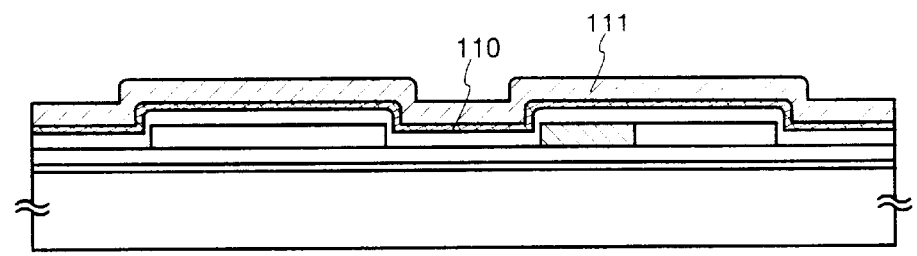

As shown in FIG. 5E, an electrically conductive film is deposited on the gate insulating film 109 in order to form a gate electrode. The conductive layer may well be formed of a single layer, but it can be formed as a stacked structure consisting of a plurality of layers, such as two layers or three layers, at need. An electrically conductive layer (A) 110 made of a metal nitride film being electrically conductive, and an electrically conductive layer (B) 111 made of a metal film were stacked in the present example. The conductive layer (B) 111 may be formed of an element which is selected from among tantalum (Ta), titanium (Ti), molybdenum (Mo) and tungsten (W), an alloy whose principal component is the element, or an alloy film in which the elements are combined (typically, an Mo—W alloy film or an Mo—Ta alloy film). On the other hand, the conductive layer (A) 110 is formed of tantalum nitride (TaN), tungsten nitride (WN), titanium nitride (TiN), molybdenum nitride (MoN) or the like. Alternatively, tungsten silicide, titanium silicide or molybdenum silicide may well be applied to the conductive layer (A) 110. The conductive layer (B) 111 should preferably have its impurity concentrations lowered in order to attain a low resistance. Especially regarding the oxygen concentration, a value of 30 ppm or less was good in the present example. Tungsten (W), for example, could realize a specific resistance of 20 μΩcm or less by setting the oxygen concentration at 30 ppm or less.

The conductive layer (A) 110 may be set at a thickness of 10~50 nm (preferably, 20~30 nm), and the conductive layer (B) 111 at a thickness of 200~400 nm (preferably, 250~350 nm). In the present example, a TaN film being 30 nm thick and a Ta film being 350 nm were respectively employed for the conductive layer (A) 110 and the conductive layer (B) 111, and both the films were formed by sputtering. The TaN film (A) 110 was formed by employing Ta as the material of a target, and a mixed gas consisting of Ar and nitrogen, as a sputtering gas. The Ta film (B) 111 was formed by employing Ar as a sputtering gas. Further, when a suitable amount of Xe or Kr is added in such a sputtering gas beforehand, the internal stresses of the film to be formed can be relieved to prevent the film from peeling off. The Ta film of α phase exhibits a resistivity of about 20 μΩcm and can be used for the gate electrode, but the Ta film of βphase exhibits a resistivity of about 180 μΩcm and was unsuited to the gate electrode in the present example. A TaN film has a crystal structure close to the α phase. In the present example, therefore, the Ta film in the α phase was readily obtained by overlaying the TaN film with a Ta film. Incidentally, although no illustration is made, it is effective that a silicon film doped with phosphorus (P) is previously formed to a thickness of about 2~20 nm under the conductive layer (A) 110. Thus, the close adhesion of the conductive film to be formed on the silicon film can be enhanced, and the oxidation thereof can be prevented. Simultaneously, an alkali metal element which the conductive layer (A) 110 or the conductive layer (B) 111 contains in a slight amount can be prevented from diffusing into the gate insulating film 109. Anyway, the conductive layer (B) 111 should preferably have its resistivity set within a range of 10~500 μΩcm.

Figure 6A:
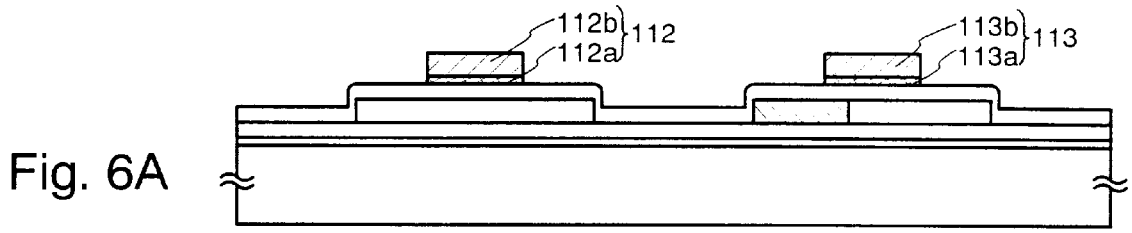
FIGS. 6A to 6E are sectional views showing the subsequent steps of the process for fabricating TFTs as shown in FIGS. 5A to 5E.

Subsequently, a resist mask of predetermined pattern is formed, and the electrically conductive layer (A) 110 and the electrically conductive layer (B) 111 are collectively etched, thereby to form gate electrodes 112, 113. By way of example, the etching step can be performed with a mixed gas consisting of $CF_4$ and $O_2$ or with $Cl_2$ gas and under a reaction pressure of 1~20 Pa by dry etching. The gate electrodes 112 and 113 are such that layers 112a and 113a originating from the conductive layer (A), and layers 112b and 113b originating from the conductive layer (B) are unitarily stacked. On this occasion, the gate electrode 113 for the n-channel TFT is formed so as to overlap the impurity region 108 through the gate insulating film 109 (FIG. 6A). Incidentally, each gate electrode can also be formed only of the conductive layer (B).

Figure 6B:
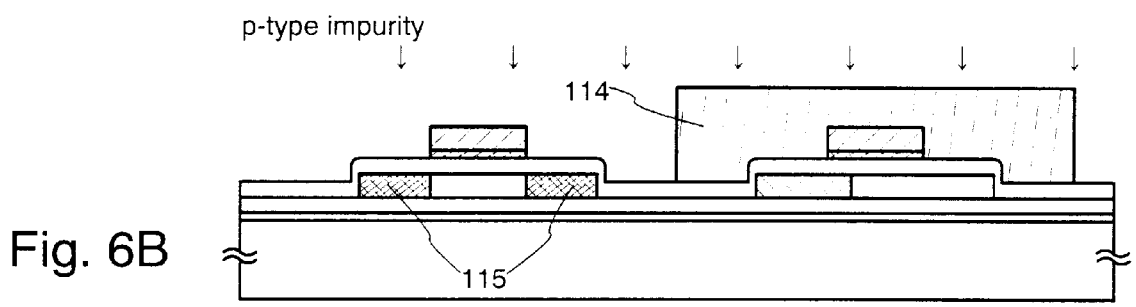

Subsequently, impurity regions 115 to serve as a source region and a drain region are formed in the insular semiconductor film 103 for forming the p-channel TFT. Herein, an impurity element giving the p-type conductivity is introduced using the gate electrode 112 as a mask, thereby to form the impurity regions 115 in self-alignment manner. On this occasion, the insular semiconductor film 104 for forming the n-channel TFT is kept covered with a resist mask 114. Besides, the impurity regions 115 are formed by ion doping which employs diborane ($B_2H_6$). The concentration of boron (B) in the regions 115 is set at $3\times10^{20}$~$3\times10^{21}$ atoms/cm$^3$ (FIG. 6B). By the way, in this specification, the concentration of the impurity element for giving the p-type conductivity, contained in the impurity regions 115 formed here, shall be expressed as ($p^+$).

Figure 6C:
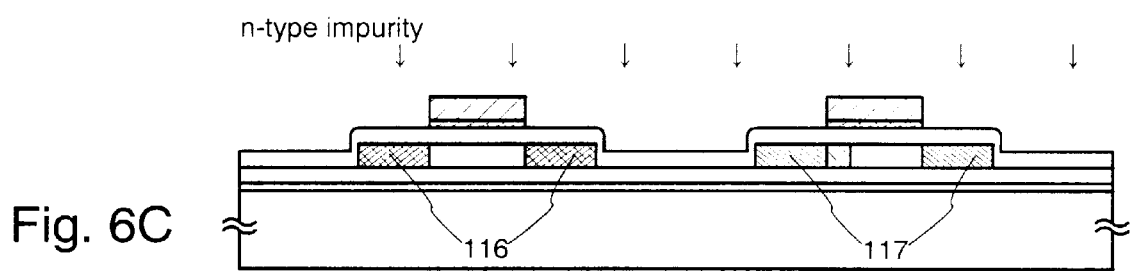

Subsequently, impurity regions 117 to serve as a source region and a drain region are formed in the insular semiconductor film 104 for forming the n-channel TFT. Here in the present example, the impurity regions 117 were formed by ion doping with phosphine ($PH_3$), and the concentration of phosphorus (P) in the regions 117 was set at $1\times10^{20}$~$1\times10^{21}$ atoms/cm$^3$ (FIG. 6C). By the way, in this specification, the concentration of the impurity element for giving the n-type conductivity, contained in the impurity regions 117 formed here, shall be expressed as ($n^+$). On this occasion, the impurity regions 115 formed by the preceding step are simultaneously doped with the element phosphorus (P). Since, however, the concentration of phosphorus (P) contained in impurity regions 116 is on the order of ½~⅓ in comparison with the concentration of boron (B) already introduced at the preceding step, the p-conductivity type is secured in the impurity regions 116, and no influence is exerted on the characteristics of the p-channel TFT.

Figure 6D:
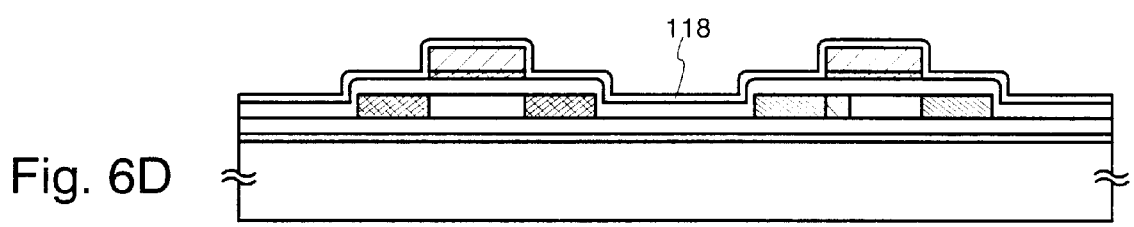

Thereafter, the processing step of activating the impurity elements giving the n-type and p-type and introduced at the respective concentrations is performed by thermal annealing. An annealing furnace may be employed for the activating step. Alternatively, laser annealing or rapid thermal annealing (RTA) can be employed. The annealing process is carried out at a temperature of 400~700° C., typically 500~600° C., in a nitrogen atmosphere whose oxygen concentration is 1 ppm or less, preferably 0.1 ppm or less. In the present example, a heat treatment was carried out at 550° C for 4 hours. Besides, a first protective insulating layer 118 being 50~200 nm thick should preferably be formed of a silicon oxynitride film, a silicon oxide film or the like before the annealing process. The silicon oxynitride film can be formed under the conditions of a reaction pressure of 160 Pa, a substrate temperature of 325° C. and a discharge power density of 0.1 W/cm$^2$ by setting the flow rates of $SiH_4$ and $N_2O$ at 27 SCCM and 900 SCCM, respectively (FIG. 6D).

In the present example, after the activating step, a heat treatment was further carried out at 300~450° C. for one hour~12 hours in an atmosphere containing 3~100 % of hydrogen, thereby to hydrogenate the insular semiconductor films (103, 104). The hydrogenating step is the processing step in which dangling bonds existing at a density of $10^{16}$~$10^{18}$/cm$^3$ in the insular semiconductor films are terminated with hydrogen atoms excited thermally. Plasma hydrogenation (which employs hydrogen excited by a plasma) may well be performed as another expedient for the hydrogenation.

After the activating and hydrogenating steps have ended, a silicon oxynitride film or a silicon oxide film is further stacked on the first protective insulating layer 118, thereby to form an interlayer insulating layer 119. Likewise to the first protective insulating layer 118, the silicon oxynitride film is formed to a thickness of 500~1500 nm (preferably, 600~800 nm) under the conditions of a reaction pressure of 160 Pa, a substrate temperature of 325 ° C. and a discharge power density of 0.15 W/cm$^2$ by setting the flow rates of $SiH_4$ and $N_2O$ at 27 SCCM and 900 SCCM, respectively. Besides, contact holes which reach the source regions and drain regions of the TFTs are formed in the interlayer insulating layer 119 and the first protective insulating layer 118, whereupon source wiring lines 120, 121 and drain wiring lines 122 are formed in the contact holes. Although no illustration is made, each of the electrodes in the present example was made of a stacked film of three-layer structure in which a Ti film being 100 nm thick, an Al film containing Ti and being 300 nm thick, and a Ti film being 150 nm thick were continuously formed by sputtering.

Subsequently, a silicon nitride film or a silicon oxynitride film is formed to a thickness of 50~500 nm (typically, 100~300 nm) as a passivation film 123. Further, when a hydrogenating process was performed in this state, favorable results for enhancements in the characteristics of the TFTs were obtained. By way of example, a heat treatment may be carried out for the hydrogenating process, at 300~450° C. for one hour~12 hours in an atmosphere containing 3~100% of hydrogen. Even when plasma hydrogenation was alternatively employed, similar effects were attained. Also, the hydrogenation can be done in such a way that hydrogen existing in the interlayer insulating 119 and the first protective insulating layer 118 is diffused into the insular semiconductor films 103, 104 by such a heat treatment. Anyway, it was desirable to set the densities of defects in the insular semiconductor films 103, 104 at about $10^{16}$/cm$^3$ or below, and it was satisfactory to afford hydrogen on the order of 0.01~0.1 atomic % for the purpose of lowering the defect densities.

Figure 6E:
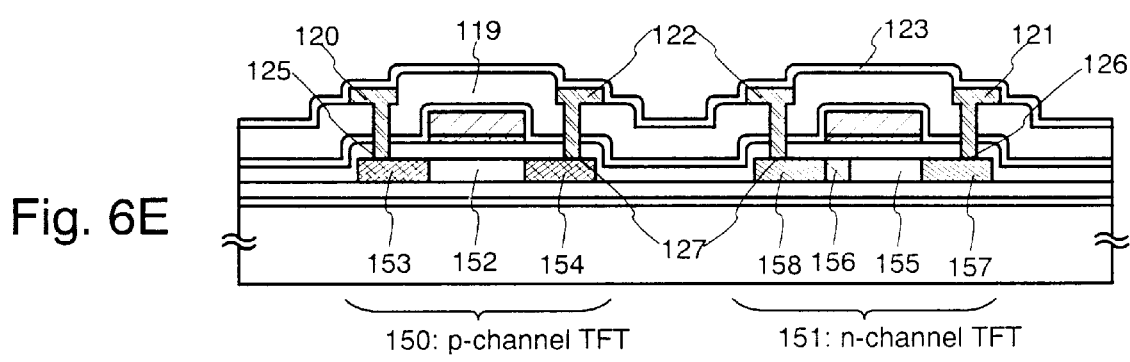

In this way, as shown in FIG. 6E, the p-channel TFT 150 and the n-channel TFT 151 could be completed on the substrate 101. The p-channel TFT 150 includes a channel forming region 152, the source region 153 and the drain region 154 in the insular semiconductor film 103. The n-channel TFT 151 includes the channel forming region 155, the LDD region 156 overlapped by the gate electrode 113 (hereinbelow, such an LDD region shall be denoted by symbol "Lov"), the source region 157 and the drain region 158 in the insular semiconductor film 104. In the present example, the length of the region Lov in the channel length direction of the TFT was set at 0.5~3.0 μm (preferably, 1.0~1.5 μm) for a channel length of 3~8 μm. Although each TFT was fabricated as a single-gate structure in the example of FIGS. 6A~6E, it may well have a double-gate structure or a multi-gate structure including a plurality of gate electrodes.

Figure 8A:
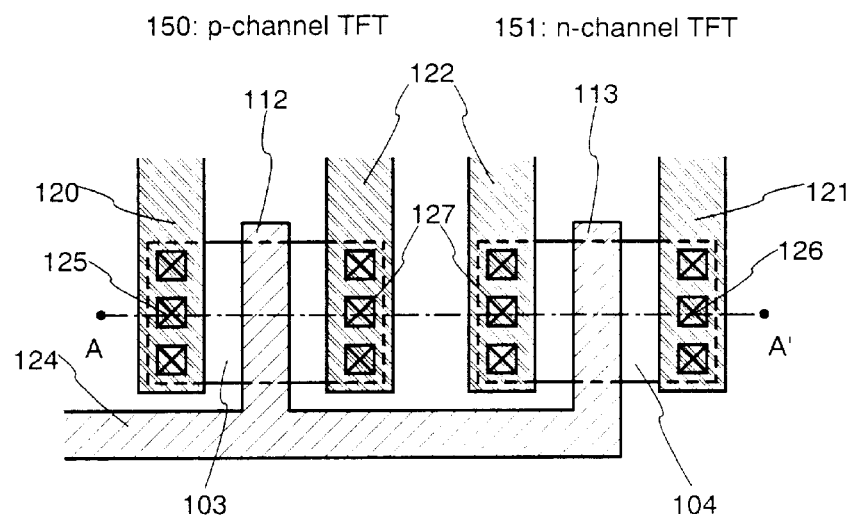
FIGS. 8A and 8B are top plan views for explaining examples of the structures of TFTs.
Figure 8B:
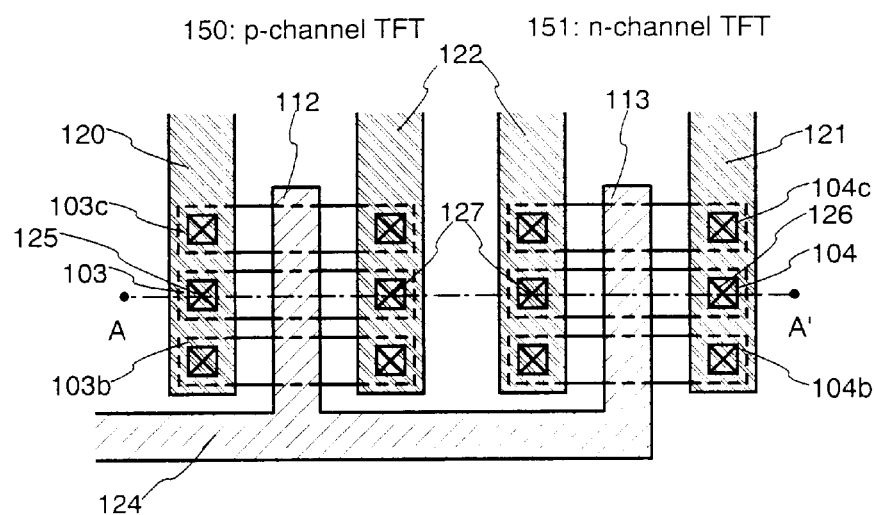

Meanwhile, FIGS. 8A and 8B are top plan views of the CMOS circuit shown in FIG. 6E, for explaining examples of the arrangement of the insular semiconductor films 103, 104, the gate electrodes 112, 113, and the source electrodes 120, 121 as well as the drain electrodes 122. Here, the base film, the gate insulating film, the protective insulating film and the interlayer insulating layer are omitted from illustration. In each of FIGS. 8A and 8B, a section A–A' corresponds to the sectional view of FIG. 6E. Referring to FIG. 8A, the insular semiconductor films 103, 104 are overlaid with the gate electrodes 112, 113, and the source wiring lines 120, 121 as well as the drain wiring lines 122. The gate electrodes 112, 113 are connected to a gate wiring line 124. Besides, the source wiring lines 120, 121 are respectively held in contact with the insular semiconductor films 103, 104 at contact portions 125, 126. Reference numeral 127 denotes a drain contact. In FIGS. 8A and 8B, the channel forming regions and the impurity regions such as the source and drain regions, which are formed in the insular semiconductor films, are omitted from illustration. Further, FIG. 8B shows the example in which each of the insular semiconductor films 103, 104 in FIG. 8A is divided into a plurality of parts. Referring to FIG. 8B, the insular semiconductor film in the p-channel TFT 150 is divided into three parts 103, 103b and 103c, and the insular semiconductor film in the n-channel TFT 151 into three parts 104, 104b and 104c. Of course, the number of divisions is not limited, and it can be made different between in the p-channel TFT and in the n-channel TFT. An inverter circuit which is the basic shape of the CMOS circuit can be formed by such a p-channel TFT 150 and an n-channel TFT 151.

The size of a TFT is stipulated by a channel length (L) and a channel width (W). Even when the insular semiconductor film is divided into the plurality of parts as in FIG. 8B, the same operating characteristics can be attained by the two TFT circuits in FIGS. 8A and 8B on condition that the channel length (L) and the total channel width (W) in the example of FIG. 8B are respectively equal to the channel length (L) and the channel width (W) in the example of FIG. 8A. In the case where, at least, the channel forming region is intended to be formed of one crystal grain as in the present invention, the intention is achieved rather more easily by dividing the insular semiconductor film into the plurality of parts and making the channel forming region of each individual part smaller as in the example of FIG. 8B.

In each of the p-channel TFT 150 and n-channel TFT 151 thus fabricated, the channel forming region is formed of one crystal grain, namely, a single crystal. As a result, current transport characteristics during the operation of each TFT are not influenced by potentials and traps at grain boundaries, and hence, characteristics comparable to those of a MOS transistor fabricated on a single-crystal silicon substrate can be attained. Besides, such TFTs can be employed for constructing a shift register circuit, a buffer circuit, a D/A converter circuit, a level shifter circuit, a multiplexer circuit, etc. A semiconductor device which is fabricated over a glass substrate, such as a liquid crystal display device, an EL display device or a close touch type image sensor, can be constructed by properly combining the circuits as mentioned above.

EXAMPLE 2

An example of the present invention will be described with reference to FIG. 9A to FIG. 13. Here, a method of fabricating the pixel TFTs of a pixel portion and the TFTs of a driver circuit disposed peripherally of the pixel portion, on the same substrate, will be described in detail in conformity with processing steps. For the brevity of explanation, however, a CMOS circuit being the basic circuit of a shift register circuit, a buffer circuit, etc., and an n-channel TFT constituting a sampling circuit shall be illustrated in the control circuit.

Referring to FIG. 9A, a substrate of barium borosilicate glass or a substrate of alumino-borosilicate glass is employed for a substrate 201. In a present example, the alumino-borosilicate glass substrate was used. On that surface of the substrate 201 over which the TFTs are to be formed, a base film 202 made of insulating films is formed. The base film 202 is provided in order to prevent an alkaline metal element or any other impurity diffusing from the substrate 201. In the present example, the base film 202 was formed as follows: A silicon oxynitride film 202a prepared from $SiH_4$, $N_2O$ and $NH_3$ by plasma CVD was deposited to a thickness of 50 nm. Further, a silicon oxynitride film 202b prepared from $SiH_4$ and $N_2O$ was stacked on the film 202a to a thickness of 100 nm in order to keep the interface thereof with a semiconductor layer favorable. Alternatively, a hydrogenated silicon oxynitride film 202b prepared from $SiH_4$, $N_2O$ and $H_2$ may well be applied in order to keep the interface thereof with the semiconductor layer favorable.

Subsequently, the semiconductor layer 203a having an amorphous structure is formed to a thickness of 25~80 nm (preferably, 30~60 nm) by a known process such as plasma CVD or sputtering. In the present example, an amorphous silicon film was formed to a thickness of 55 nm by the plasma CVD. Besides, since the base film 202 and the semiconductor layer 203a having the amorphous structure can be formed by the same film forming process, both may well be continuously formed. With this contrivance, after the formation of the base film 202, the resulting substrate structure is not once exposed to the atmospheric air. Therefore, the surface of the substrate structure can be prevented from being contaminated, and dispersions in the characteristics of the TFTs to be fabricated and fluctuations in the threshold voltages thereof can be relieved (FIG. 9A).

The semiconductor layer 203a may be left as the amorphous silicon film, and it may well be previously formed as a crystalline silicon film by employing a known crystallizing technique. Here in the present example, the crystalline semiconductor layer 203a was formed by the crystallizing method employing a catalytic element, in accordance with the technique disclosed in the official gazette of Japanese Patent Application Laid-open No. 7-130652 as mentioned in Embodiment 3.

As explained in Embodiment 2, a second protective insulating layer 266, a protective insulating film 267 and thermal conduction layers 268~273 were disposed. The second protective insulating layer 266 is formed of a silicon oxynitride film at a thickness of 50~300 nm by plasma CVD which employs $SiH_4$ and $N_2O$ as a raw material gas. Openings in the second protective insulating layer 266 can be etched and provided at a high selectivity for the underlying semiconductor layer 203a by the use of an acid solution containing hydrofluoric acid. The protective insulating film 267 is similarly formed of a silicon oxynitride film at a thickness of 10~200 nm. While the thermal conduction layers 268~273 may be formed of a material having a thermal conductivity of 10 $Wm^{-1}$ $K^{-1}$ or more, aluminum nitride (AlN) is deposited to a thickness of 50~500 nm here. The AlN layers can be formed by sputtering, and they may be formed by employing the material AlN for a target and employing argon (Ar) as a sputtering gas. In order to deposit AlN of higher purity, sputtering may well be carried out with a mixed gas consisting of nitrogen ($N_2$) and Ar, by employing aluminum (Al) for a target.

The crystallization of the semiconductor layer 203a should most preferably be performed by laser annealing, and it may be implemented in the same way as in Embodiment 1. In the structure of FIG. 9B, in the course of cooling subsequent to irradiation with a pulsed laser beam, the growth of crystal nuclei occurs preferentially in semiconductor layers 203*b* of regions A as explained before, and it thereafter proceeds laterally toward semiconductor layers 203*c* of regions B. Then, crystal grain boundaries 275 are formed at the grown ends of crystals which have originated from the regions A. In this way, a crystalline silicon film in which the locations of crystal grains are controlled can be obtained.

Thereafter, a resist pattern is formed on the resulting crystalline silicon film, and insular semiconductor films 204~207 are formed by dry etching. On this occasion, the grain boundaries 275 should desirably be removed. The positions of the thermal conduction layers 268~274 need to be set so that, even when the grain boundaries 275 remain in the insular semiconductor films, they may not overlap, at least, the channel forming regions of the TFTs. Since, however, defect levels at a density of $10^{16}$~$10^{18}$/cm$^3$ remain in the insular semiconductor films 204~207 thus prepared, the defect level density needs to be lowered by performing the processing step of hydrogenation later. Subsequently, a mask layer 208 which is made of a silicon oxide film having a thickness of 50~100 nm is formed by plasma CVD, low-pressure CVD or sputtering. For example, the silicon oxide film is formed by the low-pressure CVD employing a mixed gas consisting of SiH$_4$ and O$_2$, and under the conditions of a reaction pressure of 266 Pa and a substrate temperature of 400 ° C. (FIG. 9C).

The step of channel doping in the present example was performed as follows: A resist mask 209 was provided, and the whole surfaces of the insular semiconductor films 205~207 for forming the n-channel TFTs were doped with boron (B) as an impurity element for giving the p-type conductivity, at a concentration of about $1 \times 10^{16}$~$5 \times 10^{17}$ atoms/cm$^3$ in order to control the threshold voltages of the TFTs. The doping with boron (B) may well be performed by ion doping, and it may well be done at the same time as the formation of the amorphous silicon film 203*a*. Here, the doping with boron (B) is not always necessary. The semiconductor layers 210~212 doped with boron (B), however, were favorable for the purpose of confining the threshold voltages of the n-channel TFTs within a predetermined range (FIG. 9D). The values of the threshold values of the TFTs are also affected by the properties of gate insulating films and base films, so that the step of the doping can be omitted according to the judgement of a person who designs a semiconductor device. Besides, the whole surface of the substrate structure shown in FIG. 9C may well be doped with the impurity element giving the p-type conductivity, without providing the resist mask 209.

Figure 10A:
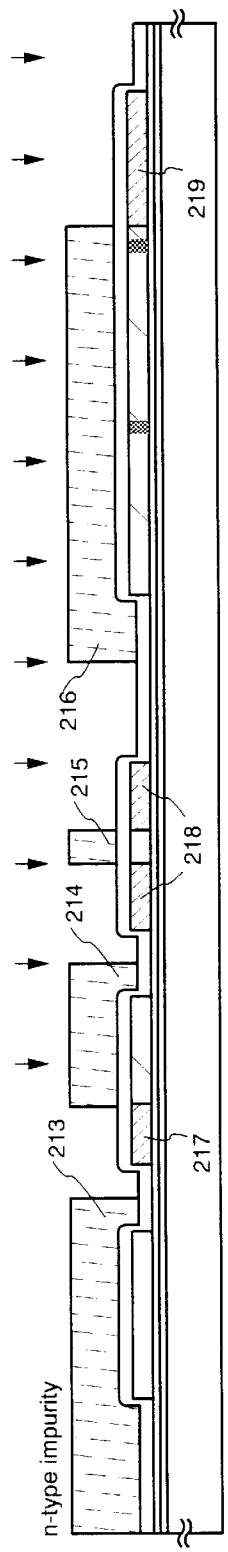
FIGS. 10A to 10D are sectional views showing the process for fabricating the pixel TFTs and the TFTs of the driver circuit.

In order to form the LDD regions of the n-channel TFTs of the driver circuit, the insular semiconductor films 210, 211 are selectively doped with an impurity element giving the n-type. conductivity. In the present example, resist masks 213~216 were formed beforehand. Here, ion doping which employed phosphine (PH$_3$) was applied in order to introduce phosphorus (P). The concentration of phosphorus (P) in impurity regions (n$^-$) 217, 218 formed was set at $1 \times 10^{17}$~$5 \times 10^{17}$ atoms/cm$^3$ (FIG. 10A). Further, an impurity region 219 is a semiconductor layer for forming the storage capacitor of the pixel portion. This region was doped with phosphorus (P) at the same concentration.

Subsequently, the resist masks 213~216 are completely removed, and the mask layer 208 is further removed with hydrofluoric acid or the like, whereupon the processing step of activating the impurity elements introduced at the steps of FIG. 9D and FIG. 10A is performed. The activation can be effected by an expedient such as laser annealing, or thermal annealing for 1~4 hours at 500~600° C. in a nitrogen atmosphere. Alternatively, both the expedients may be used conjointly. In the case of the laser annealing, the emergent beam of a KrF excimer laser (at a wavelength of 248 nm) is defined into a rectilinear beam, and the whole surface of the substrate structure formed with the insular semiconductor films is irradiated with the rectilinear beam under the conditions of a lasing frequency of 5~50 Hz, an energy density of 100~500 mJ/cm$^2$ and a scanning-beam overlap proportion of 80~98%. Incidentally, the conditions for the irradiation with the laser beam are not especially restricted, but they may be properly determined by the person in charge.

Figure 10B:
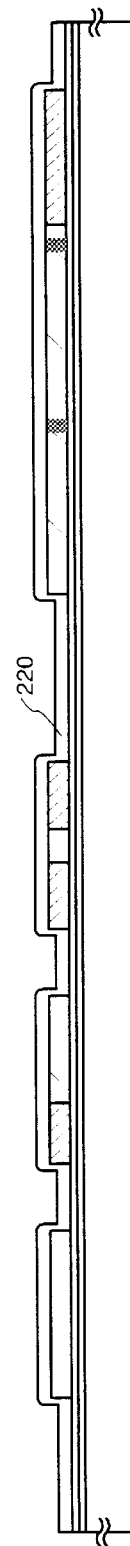

In addition, a gate insulating film 220 is formed of an insulating film containing silicon, at a thickness of 40~150 nm by employing plasma CVD or sputtering. For example, it is formed of a silicon oxynitride film prepared by the plasma CVD employing SiH$_4$ and N$_2$O as raw materials and under the conditions of a substrate temperature of 300~450° C. and a radio-frequency power density of 0.1~1.0 W/cm$^2$. At this step, prior to the formation of the silicon oxynitride film, the substrate structure may well be pre-processed for 2 minutes by introducing hydrogen at a flow rate of 200 SCCM and forming a plasma under a radio-frequency power density of 0.2 W/cm$^2$. Also, the substrate structure may well be processed with a plasma similarly formed by introducing hydrogen at 100 SCCM and oxygen at 100 SCCM. Alternatively, the substrate structure may well be processed for several minutes at a radio-frequency power density of 0.1~0.5 W/cm$^2$ by introducing N$_2$O and hydrogen. At such a step employing the plasma CVD, the person in charge may properly determine a pressure for forming the plasma, preferably within a range of 10~100 Pa (FIG. 10B).

Figure 10C:
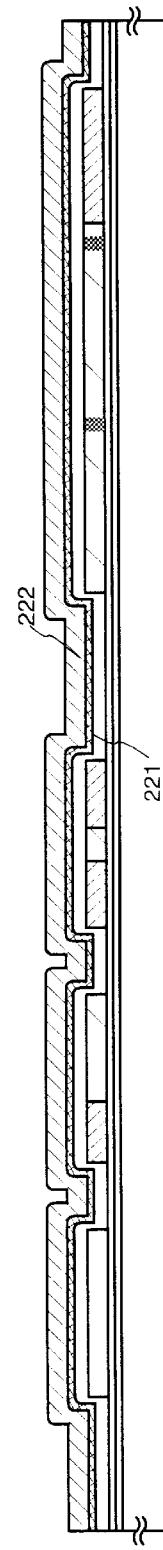

Subsequently, a first electrically-conductive layer is deposited in order to form gate electrodes. An electrically conductive layer (A) 221 made of a metal nitride film being electrically conductive, and an electrically conductive layer (B) 222 made of a metal film were stacked in the present example. Here, the conductive layer (B) 222 was formed of tungsten (W) to a thickness of 250 nm by sputtering with tungsten (W) employed for a target, while the conductive layer (A) 221 was similarly formed of tungsten nitride (WN) to a thickness of 50 nm (FIG. 10C). Alternatively, a tungsten (W) film can be formed in accordance with thermal CVD by employing tungsten hexafluoride (WF$_6$). Anyway, the W film should desirably have its resistivity set at 20 $\mu\Omega$cm or less in order to be used for the gate electrodes. The W film can have its resistivity lowered by enlarging crystal grains, but it has its crystallization hampered to turn into a high resistivity, in a case where impurity elements such as oxygen are contained in large amounts in this W film. In the case of employing the sputtering, therefore, the W film is formed by employing a W target at a purity of 99.9999% and by taking sufficient care so that impurities do not mix from within a gaseous phase during the formation of the film. Thus, a W film exhibiting a resistivity of 9~20 $\mu\Omega$cm can be realized.

Figure 10D:
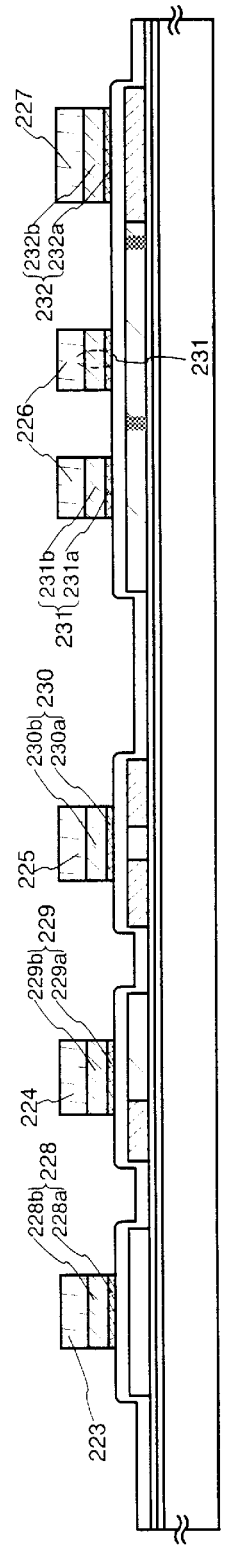

Subsequently, resist masks 223~227 are formed, and the electrically conductive layer (A) 221 and the electrically conductive layer (B) 222 are collectively etched, thereby to form the gate electrodes 228~231 and a capacitor wiring line 232. The gate electrodes 228~231 and the capacitor wiring line 232 are such that layers 228*a*~232*a* originating from the conductive layer (A), and layers 228*b*~232*b* originating from the conductive layer (B) are unitarily stacked. On this occasion, the gate electrodes 229, 230 constituting the driver circuit are formed so as to overlap the impurity regions 217, 218 through the gate insulating film 220 (FIG. 10D).

Subsequently, in order to form the source region and drain region of the p-channel TFT of the driver circuit, the step of doping with an impurity element giving the p-type conductivity is carried out. Herein, the impurity element is introduced using the gate electrode 228 as a mask, thereby to form impurity regions in self-alignment manner. On this occasion, regions for forming the n-channel TFTs are kept covered with a resist mask 233. In the present example, the impurity regions (p⁺) 234 were formed by ion doping which employed diborane ($B_2H_6$), and at a boron concentration of $1\times10^{21}$ atoms/cm³ (FIG. 11A).

Subsequently, impurity regions to serve as source regions and drain regions were formed for the n-channel TFTs. More specifically, resist masks 235~237 were deposited, and an impurity element giving the n-type conductivity was introduced, thereby to form the impurity regions 239~242. The impurity regions (n⁺) 239~242 were formed by ion doping with phosphine ($PH_3$), and the concentration of phosphorus (P) in the these regions was set at $5\times10^{20}$ atoms/cm³ (FIG. 11B). On this occasion, the impurity regions 234 formed by the preceding step are simultaneously doped with the element phosphorus (P). Since, however, the concentration of phosphorus (P) contained in impurity regions 238 is on the order of ½~⅓ in comparison with the concentration of boron (B) already introduced at the preceding step, the influence of the introduced phosphorus (P) needed not be considered, and the characteristics of the p-channel TFT were not affected at all.

Besides, in order to form the LDD regions of the n-channel TFTs of the pixel portion, the step of doping with an impurity element giving the n-type conductivity is carried out. Here in the present example, using the gate electrodes 231 as masks, the impurity element giving the n-type conductivity was introduced in self-alignment manner by ion doping. The concentration of phosphorus (P) to be introduced is set at $5\times10^{16}$ atoms/cm³, which is lower than the concentrations of the impurity elements introduced at the steps of FIG. 9A, FIG. 10A and FIG. 10B. In effect, accordingly, only impurity regions (n⁻⁻) 243, 244 are formed (FIG. 11C).

Thereafter, the step of a heat treatment is performed in order to activate the impurity elements giving the n-type and p-type and introduced at the respective concentrations. This step can be implemented by thermal annealing with an annealing furnace, laser annealing or rapid thermal annealing (RTA). Here in the present example, the activating step was carried out by the furnace annealing. In order to prevent the oxidation of the W films for the gate electrodes to the utmost, the heat treatment is performed at a temperature of 400~700° C., typically 500~600° C., in a nitrogen atmosphere whose oxygen concentration is 1 ppm or less, preferably 0.1 ppm or less. In the present example, a heat treatment was performed at 550 ° C. for 4 hours.

In the thermal annealing, the W films 228b~232b which constitute the gate electrodes 228~231 and the capacitor wiring line 232 are nitrified at a thickness of 5~80 nm from their surfaces, so that electrically conductive layers (C) 228c~232c made of WN are formed anew. Otherwise, tantalum nitride (TaN) can be formed in a case where the electrically conductive layers (B) 228b~232b are made of Ta, and titanium nitride (TiN) can be formed in a case where they are made of titanium (Ti). Also, such new layers can be similarly formed when the gate electrodes etc. 228~232 are exposed in a plasma atmosphere containing nitrogen as based on nitrogen, ammonia or the like. Further, the processing step of hydrogenating the insular semiconductor films is performed by thermal annealing which proceeds at a temperature of 300~450 ° C. for one hour ~12 hours in an atmosphere containing 3~100% of hydrogen. The hydrogenating step is the processing step in which dangling bonds existing at a density of $10^{16}10^{18}$/cm³ in the insular semiconductor films are terminated with hydrogen atoms excited thermally. Plasma hydrogenation (which employs hydrogen excited by a plasma) may well be performed as another expedient for the hydrogenation.

In the case where the catalytic element promoting the crystallization of silicon is used at the crystallizing step, it remains slightly (on the order of $1\times10^{17}$~$1\times10^{19}$ atoms/cm³) in the insular semiconductor films. Of course, the TFTs can be finished up even in such a state. In the present example, however, it was more favorable to eliminate the remaining catalytic element from, at least, the channel forming regions. One expedient for eliminating the catalytic element is to utilize a gettering action owing to phosphorus (P). The concentration of phosphorus (P) required for gettering may be nearly equal to the P concentration of the impurity regions (n⁺) formed at the step of FIG. 10B. Owing to the thermal annealing of the activating step carried out here, the catalytic element can be segregated from the channel forming regions of the n-channel TFTs and the p-channel TFT into the impurity regions 238~242, thereby to be gettered. As a result, the catalytic element on the order of $1\times10^{17}$~$1\times10^{19}$ atoms/cm³ was segregated in the impurity regions 238~242 (FIG. 11D).

Figure 14A:
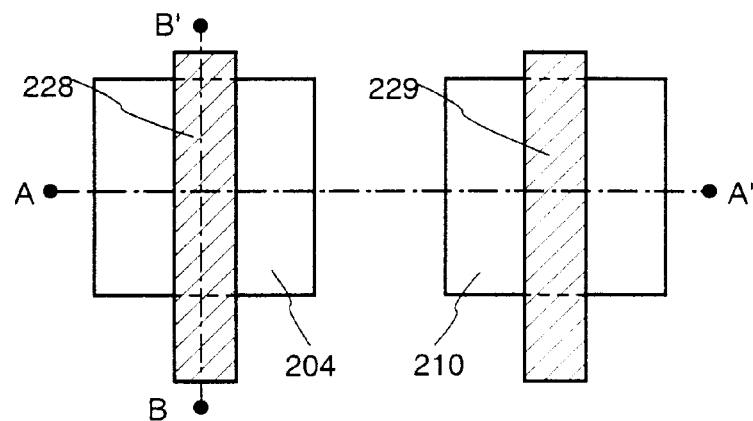
FIGS. 14A to 14C are top plan views showing the process for fabricating the TFTs of the driver circuit.
Figure 15A:
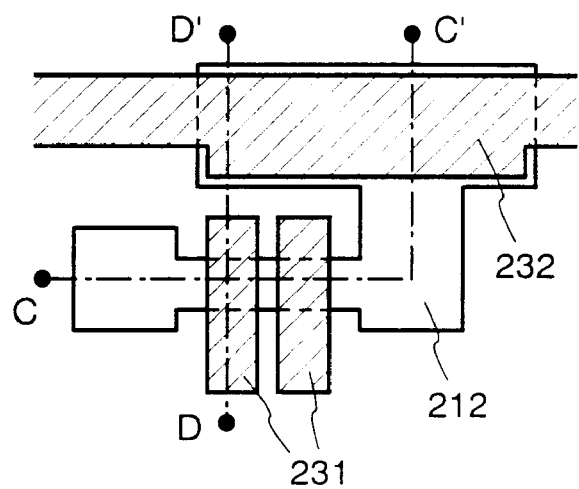
FIGS. 15A to 15C are top plan views showing the process for fabricating the pixel TFTs.
Figure 16A:
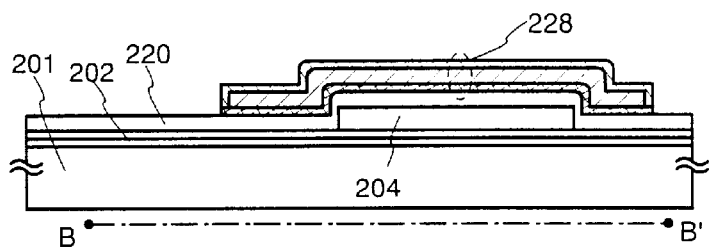
FIGS. 16A to 16C are sectional views showing the process for fabricating the TFTs of the driver circuit.
Figure 17A:
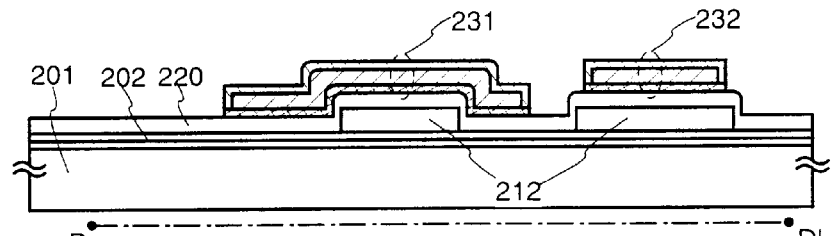
FIGS. 17A to 17C are sectional views showing the process for fabricating the pixel TFTs.

FIG. 14A and FIG. 15A are top plan views of the TFTs shown in FIG. 11D, and a section A–A' and a section C–C' correspond to A–A' and C–C' indicated in FIG. 11D, respectively. Besides, a section B–B' and a section D–D' correspond to sectional views of FIG. 16A and FIG. 17A, respectively. While the gate insulating film is omitted from illustration in the top plan views of FIG. 14A and FIG. 15A, the insular semiconductor films 204, 210, 212 are overlaid with the gate electrodes 228, 229, 231 and the capacitor wiring line 232 as shown in the figures, by the steps thus far described.

When the activating and hydrogenating steps have ended, a second electrically-conductive layer to form gate wiring lines is deposited. The second conductive layer is formed of an electrically conductive layer (D) whose principal component is aluminum (Al) or copper (Cu) being a low resistance material. Anyway, the resistivity of the second conductive layer is set at about 0.1~10 μΩcm. Further, an electrically conductive layer (E) made of titanium (Ti), tantalum (Ta), tungsten (W) or molybdenum (Mo) may be stacked and formed. In the present example, an aluminum (Al) film containing 0.1~2 weight % of titanium (Ti) was formed as the conductive layer (D) 245, and a titanium (Ti) film as the conductive layer (E) 246.

The conductive layer (D) 245 may be set at a thickness of 200~400 nm (preferably, 250~350 nm), while the conductive layer (E) 246 may be set at a thickness of 50~200 nm (preferably, 100~150 nm) (FIG. 12A).

In the present example, in order to form the gate wiring lines connected to the gate electrodes, the conductive layer (E) 246 and the conductive layer (D) 245 were subjected to etching processes so as to form gate wiring lines 247, 248 and a capacitor wiring line 249. The etching processes were so performed that a region from the surface of the conductive layer (E) to an intermediate depthwise position of the conductive layer (D) was first removed by dry etching which employed a mixed gas consisting of $SiCl_4$, $Cl_2$ and $BCl_3$, and that the remaining part of the conductive layer (D) was thereafter removed by wet etching with an etching solution based on phosphoric acid. Thus, the gate wiring lines could be formed at a favorable selective workability for the underlying semiconductor layer.

In a case, for example, where the size of a display region in a liquid crystal display device is of 4-inch class or below or where one side of a substrate is not longer than 100 mm, such gate wiring lines need not be formed of the low resistance material as shown in this example, but they can be formed of the same material as that of the gate electrodes made of W, Ta or the like.

Figure 14B:
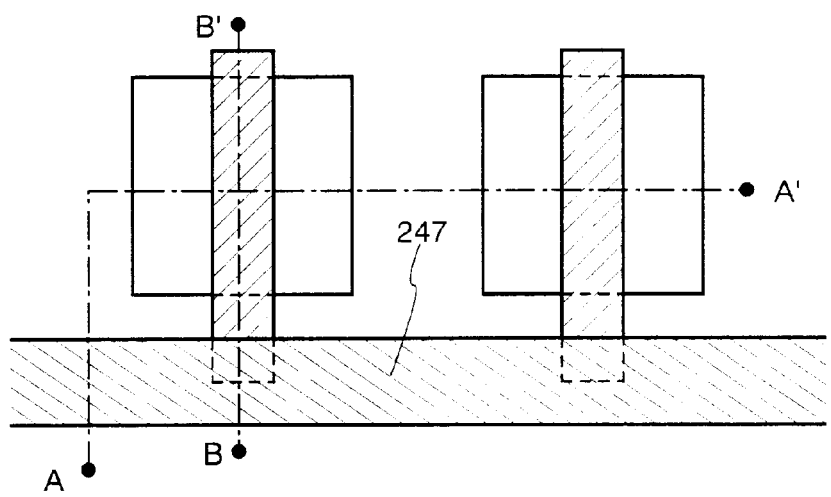
Figure 15B:
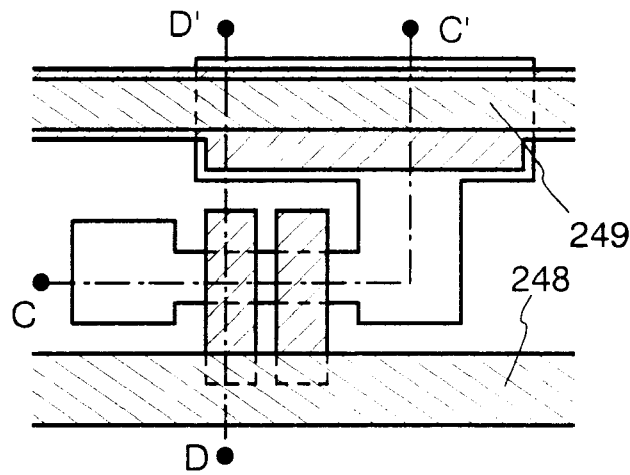
Figure 16B:
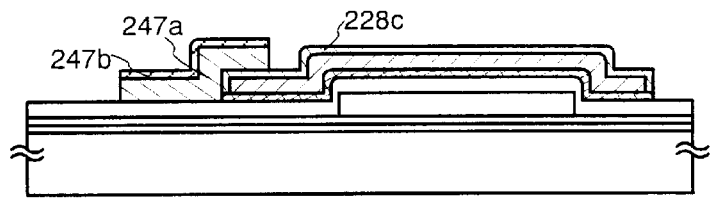
Figure 17B:
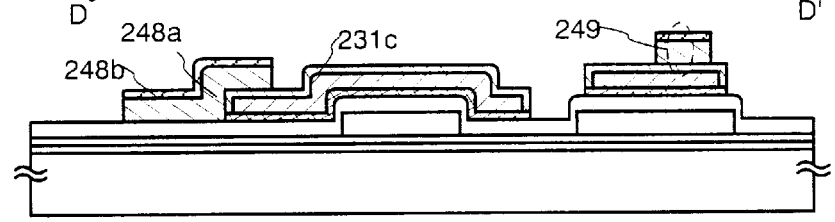

FIG. 14B and FIG. 15B are top plan views in this state, and a section A–A' and a section C–C' correspond to A–A' and C–C' indicated in FIG. 12B, respectively. Besides, a section B–B' and a section D–D' correspond to sectional views of FIG. 16B and FIG. 17B, respectively. Referring to FIG. 14B and FIG. 15B, parts of the gate wiring lines 247, 248 are placed on parts of the gate electrodes 228, 229, 231 and are held in electrical touch. This situation is also apparent from the sectional structural views of FIG. 16B and FIG. 17B corresponding to the section B–B' and the section D–D', respectively, and the conductive layer (C) forming the first conductive layer lies in electrical touch with the conductive layer (D) forming the second conductive layer.

A first interlayer insulating film 250 is formed of a silicon oxide film or an silicon oxynitride film to a thickness of 500~1500 nm. In the present example, the insulating film 250 was formed under the conditions of a reaction pressure of 160 Pa, a substrate temperature of 325° C. and a discharge power density of 0.15 W/cm$^2$ by setting the flow rates of $SiH_4$ and $N_2O$ at 27 SCCM and 900 SCCM, respectively. Thereafter, contact holes which reach the source regions and drain regions formed in the respective insular semiconductor films are provided in the interlayer insulating layer 250 and the first protective insulating layer 203a, whereupon source wiring lines 251~254 and drain wiring lines 255~258 are formed in the contact holes. Although no illustration is made, each of the electrodes in the present example was made of a stacked film of three-layer structure in which a Ti film being 100 nm thick, an Al film containing Ti and being 300 nm thick, and a Ti film being 150 nm thick were continuously formed by sputtering.

Subsequently, a silicon nitride film, a silicon oxide film or a silicon oxynitride film is formed to a thickness of 50~500 nm (typically, 100~300 nm) as a passivation film 259. Further, when a hydrogenating process was performed in this state, favorable results for enhancements in the characteristics of the TFTs were obtained. By way of example, a heat treatment may be carried out for the hydrogenating process, at 300~450° C. for one hour ~12 hours in an atmosphere containing 3~100% of hydrogen. Even when plasma hydrogenation was alternatively employed, similar effects were attained. Also, the hydrogenation can be done in such a way that hydrogen existing in the first interlayer insulating film 250 is diffused into the insular semiconductor films 204, 210~212 by such a heat treatment. Anyway, it was desirable to set the densities of defects in the insular semiconductor films 204, 210~212 at about $10^{16}/cm^3$ or below, and it was satisfactory to afford hydrogen on the order of 0.01~0.1 atomic % for the purpose of lowering the defect densities (FIG. 12C). Incidentally, at this stage, openings may well be provided in the passivation film 259 at a position where a contact hole for connecting a pixel electrode and the drain wiring line is formed later.

Figure 14C:
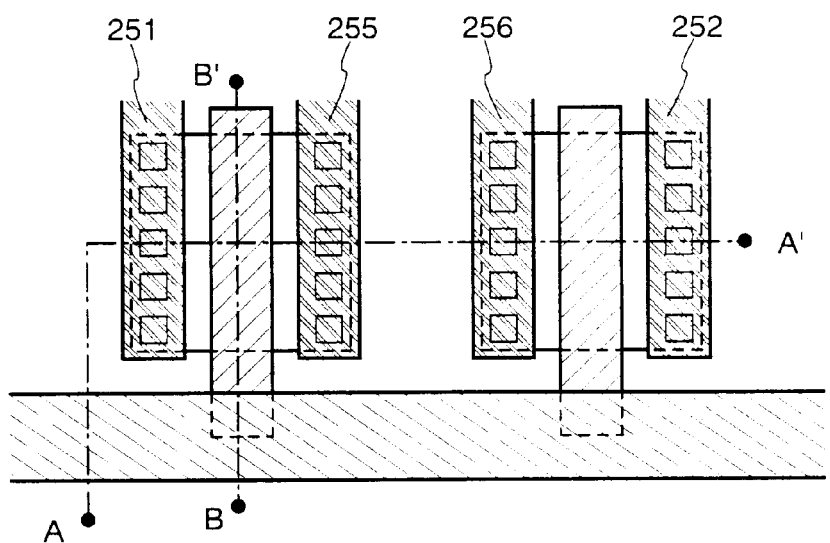
Figure 15C:
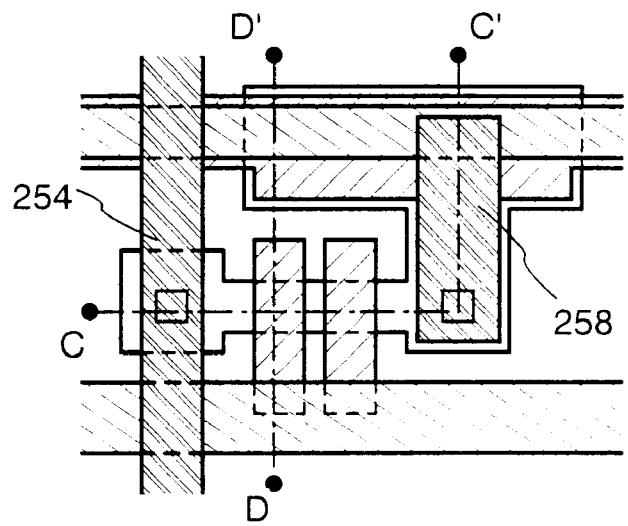
Figure 16C:
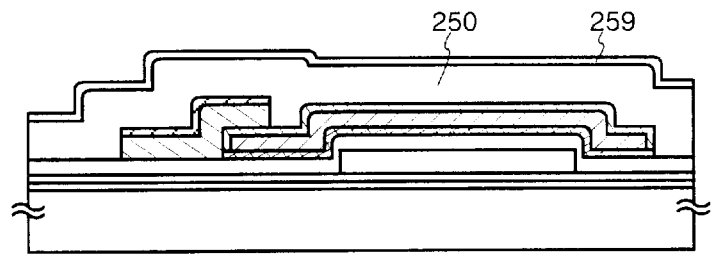
Figure 17C:
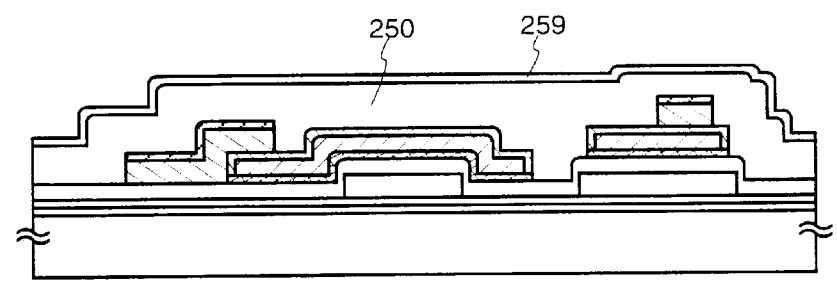

FIG. 14C and FIG. 15C are top plan views in this state, and a section A–A' and a section C–C' correspond to A–A' and C–C' indicated in FIG. 12C, respectively. Besides, a section B–B' and a section D–D' correspond to sectional views of FIG. 16C and FIG. 17C, respectively. While the first interlayer insulating film 250 is omitted from illustration in FIG. 14C and FIG. 15C, the source wiring lines 251, 252, 254 and the drain wiring lines 255, 256, 258 are respectively connected to the unshown source and drain regions of the insular semiconductor films 204, 210, 212 through the contact holes provided in the first interlayer insulating film 250.

Thereafter, a second interlayer insulating film 260 made of an organic resin is formed to a thickness of 1.0~1.5 $\mu$m. Usable as the organic resin is polyimide, an acrylic resin, polyamide, polyimide amide, BCB (benzocyclobutene), or the like. Here in the present example, polyimide of the type which is applied onto the resulting substrate structure and is thereafter thermally polymerized, was employed and was baked at 300 ° C., thereby to form the film 260. Besides, the contact hole reaching the drain wiring line 258 is provided in the second interlayer insulating film 260, and pixel electrodes 261, 262 are formed. A transparent electrically-conductive film may be employed for the pixel electrodes in case of a liquid crystal display device of transmission type, whereas a metal film may be employed therefor in case of a liquid crystal display device of reflection type. In the present example, an indium tin oxide (ITO) film was formed to a thickness of 100 nm by sputtering in order to fabricate the transmission type liquid crystal display device (FIG. 13).

In this way, the substrate structure having the TFTs of the driver circuit and the pixel TFT of the pixel portion on the same substrate could be finished up. The p-channel TFT 301, the first n-channel TFT 302 and the second n-channel TFT 303 were formed in the driver circuit, while the pixel TFT 304 and the storage capacitor 305 were formed in the pixel portion. In this specification, such a substrate structure shall be called the "active matrix substrate" for the sake of convenience.

In the p-channel TFT 301 of the driver circuit, the insular semiconductor film 204 includes a channel forming region 306, source regions 307a, 307b and drain regions 308a, 308b. In the first n-channel TFT 302, the insular semiconductor film 210 includes a channel forming region 309, an LDD region (Lov) 310 overlapped by the gate electrode 231, a source region 311 and a drain region 312. The length of the Lov region in the channel length direction of the TFT is set at 0.5~3.0 $\mu$m, preferably 1.0~1.5 $\mu$m. In the second n-channel TFT 303, the insular semiconductor film 211 includes a channel forming region 313 and an Lov region as well as an Loff region (which is LDD regions (314 and 315) not overlapped by the gate electrode), and the length of the Loff region in the channel length direction of the TFT is 0.3~2.0 $\mu$m, preferably 0.5~1.5 $\mu$m. Reference numerals 316 and 317 denote a source region and a drain region, respectively. In the pixel TFT 304, the insular semiconductor film 212 includes channel forming regions 318, 319, Loff regions 320~323, and source and drain regions 324~326. The length of each Loff region in the channel length direction of the TFT is 0.5~3.0 $\mu$m, preferably 1.5~2.5 $\mu$m. Further, the storage capacitor 305 is formed of the capacitor wiring lines 232, 249, an insulating film which is made of the same material as that of the gate insulating film 220, and a semiconductor layer 327 which is connected to the drain region 326 of the pixel TFT 304 and which is doped with an impurity element giving the n-type conductivity. Although, in this example, the pixel TFT 304 has a double-gate structure, it may well have a single-gate structure or a multi-gate structure including a plurality of gate electrodes.

The construction as described above makes it possible to optimize the structures of the TFTs constituting the individual circuits, in accordance with specifications required for the pixel TFT and the driver circuit, and to enhance the operating performance and reliability of the semiconductor device. Further, the activation of the LDD region and the source and drain regions is facilitated by forming the gate electrode out of a heat-resistant electrically-conductive material, and a wiring resistance can be sufficiently lowered by forming the gate wiring line out of a low resistance material. Accordingly, the above construction is applicable to the display device whose display region (screen size) is of 4-inch class or above. Further, the crystalline silicon film having the single-crystal structure formed selectively round the channel forming region is employed, whereby an S value of from 0.10 to 0.30 V/dec, a threshold voltage Vth of from 0.5 to 2.5 V, and a field effect mobility of 300 $cm^2$/Vsec or more can be realized in the n-channel TFT finished up. Besides, an S value of from 0.10 to 0.30 V/dec, a threshold voltage Vth of from −2.5 to −0.5 V, and a field effect mobility of 200 $cm^2$/Vsec or more can be realized in the p-channel TFT finished up.

Incidentally, although the crystallizing method explained in Embodiment 2 has been chiefly referred to in this example, it is also possible to apply the crystallizing method explained in Embodiment 1, or to perform the crystallizing method employing the catalytic element as explained in Embodiment 3, in combination with the method of Embodiment 1 or 2.

EXAMPLE 3

Figure 19:
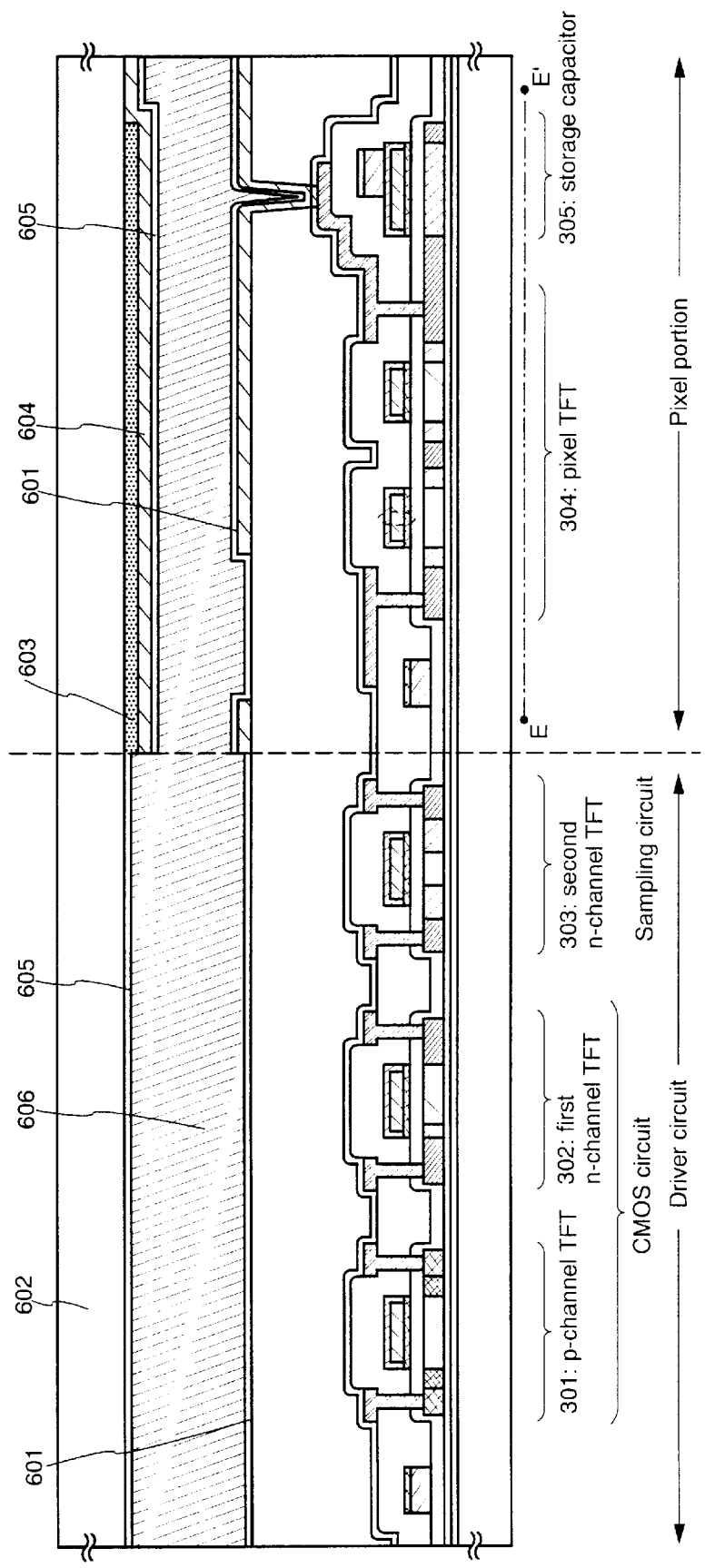
FIG. 19 is a sectional view showing the structure of a liquid crystal display device.

In this example, there will be described a process for fabricating a liquid crystal display device of active matrix type from the active matrix substrate fabricated in Example 2. As shown in FIG. 19, an orientation film 601 is formed on the active matrix substrate in the state of FIG. 13. Usually, a polyimide resin is often employed for the orientation film of a liquid crystal display element. In a present example, an opposite substrate 602 on a side opposing to the active matrix substrate was formed with a light intercepting film 603, a transparent electrically-conductive film 604 and an orientation film 605. After having been formed, each orientation film was subjected to a rubbing treatment so that liquid crystal molecules might be oriented with a certain pre-tilt angle. Besides, the active matrix substrate formed with the pixel portion and the CMOS circuit was stuck with the opposite substrate through a sealing material (not shown), spacers (not shown) or the like by a known cell assemblage process. Thereafter, a liquid crystal material 606 was injected between both the substrates, and the resulting assembly was completely sealed with a sealant (not shown). The liquid crystal material 606 may be any known one. In this way, the active matrix type liquid crystal display device shown in FIG. 19 was finished up.

Next, the construction of the active matrix type liquid crystal display device will be explained with reference to the perspective view of FIG. 20 and the top plan view of FIG. 21. Incidentally, common reference numerals are assigned to FIGS. 20 and 21 in order to bring these figures into correspondence with the sectional structural views of FIG. 9A to FIG. 13 and FIG. 19. Besides, a sectional structure along E–E' as indicated in FIG. 21 corresponds to the sectional views of a pixel matrix circuit as shown in FIGS. 13 and 19.

Figure 20:
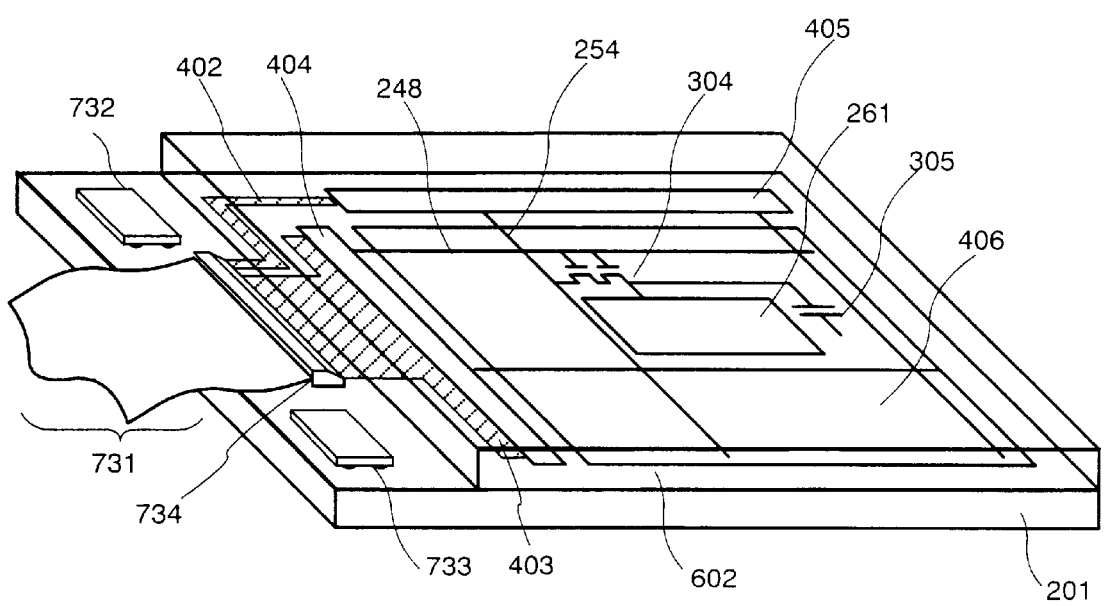
FIG. 20 is a perspective view showing the structure of the liquid crystal display device.

Referring to FIG. 20, the active matrix substrate is configured of a pixel portion 406, a scanning-signal driver circuit 404 and an image-signal driver circuit 405 which are formed on a glass substrate 201. Pixel TFTs 304 are disposed in a display region, and the driver circuits disposed peripherally are constructed on the basis of CMOS circuits. The scanning-signal driver circuit 404 and the image-signal driver circuit 405 are respectively connected to the pixel TFTs 304 by gate wiring lines 248 and source wiring lines 254. Besides, an FPC (Flexible Printed Circuit) 731 is connected to external input terminals 734, and it is connected to the respective driver circuits by input wiring lines 402, 403. Reference numerals 732 and 733 denote IC chips.

Figure 21:
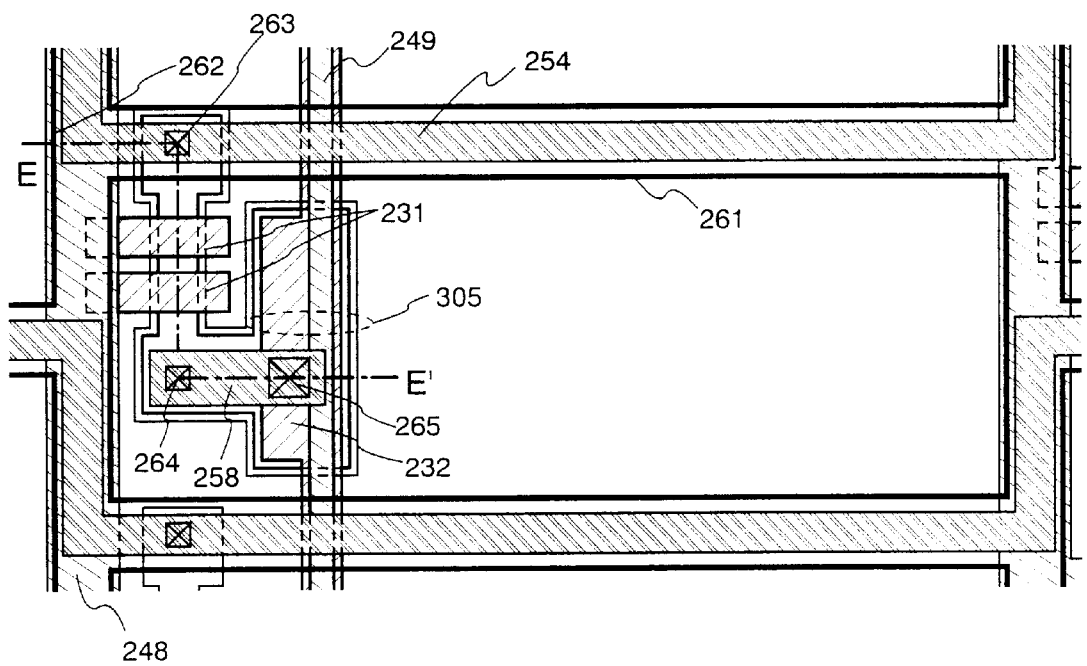
FIG. 21 is a top plan view showing the pixel of a pixel portion.

FIG. 21 is the top plan view showing that part of the display region 406 which corresponds substantially to one pixel. The gate electrodes 231 connected to the gate wiring line 248 extends across the underlying semiconductor layer 212 through the gate insulating film not shown. Although not shown, the source region, the drain region and the Loff region made of the n⁻⁻region are formed in the semiconductor layer. In addition, numeral 263 designates the contact part between the source wiring line 254 and the source region 324, numeral 264 does the contact part between drain wiring line 258 and the drain region 326, and numeral 265 does the contact part between the drain wiring line 258 and the pixel electrode 261. The storage capacitor 305 is constructed of the semiconductor layer 327 which is extended from the drain region 326 of the pixel TFT 304, and the region in which the capacitor wiring lines 232, 249 lie one over the other through the gate insulating film.

EXAMPLE 4

Figure 18:
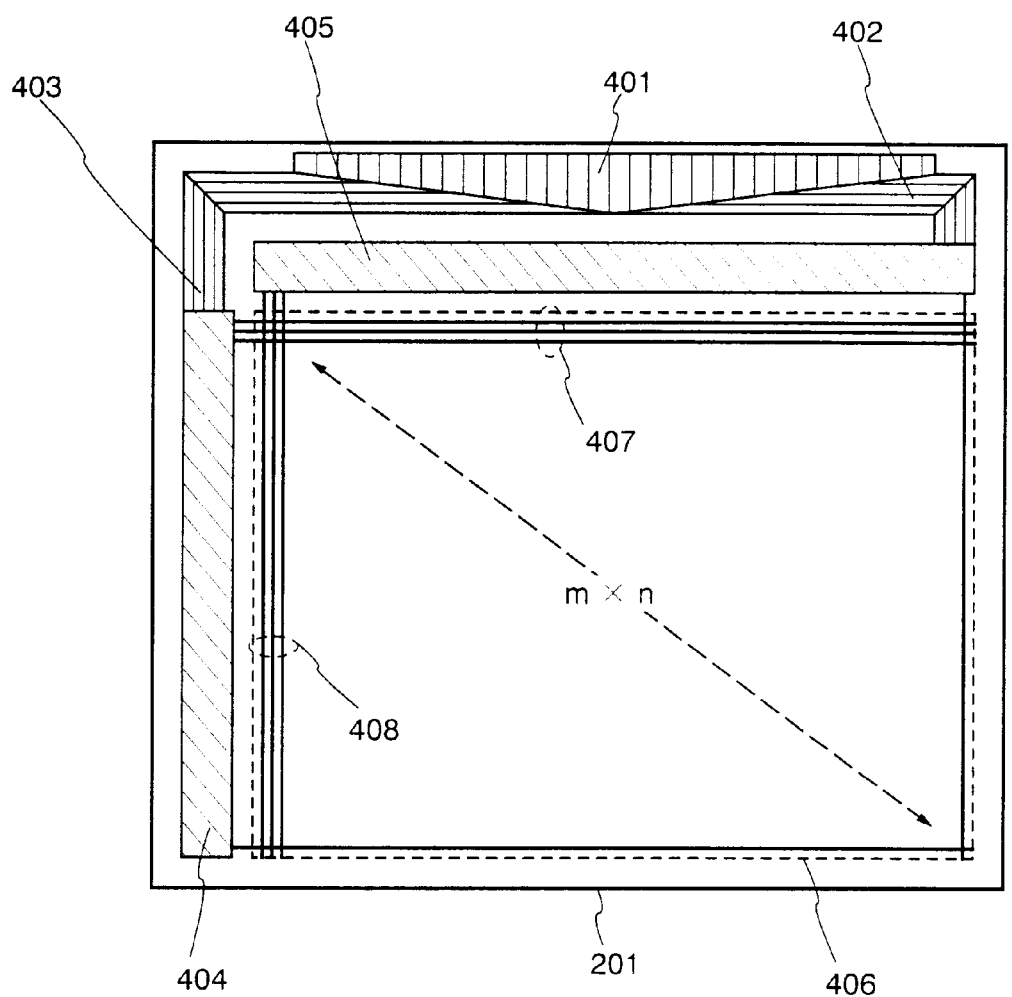
FIG. 18 is a top plan view for explaining the input/output terminals, wiring lines and circuit arrangement of a liquid crystal display device.

FIG. 18 is a schematic view showing an example of the arrangement of the input/output terminals, display region and driver circuits of a liquid crystal display device. In a pixel portion 406, m gate wiring lines 407, and n source wiring lines 408 are laid crosswise in a matrix shape. By way of example, in case of a pixel density of VGA (Video Graphics Array), 480 gate wiring lines and 640 source wiring lines are laid, and in case of a pixel density of XGA (eXtended Graphics Array), 768 gate wiring lines and 1024 source wiring lines are laid. Regarding the screen size of the display region, in case of the 13-inch class, the length of a diagonal line becomes 340 mm, and in case of the 18-inch class, the length becomes 460 mm. In incarnating such a liquid crystal display device, the gate wiring lines need to be formed of the low resistance material as explained in Example 3. When the time constant (resistance× capacitance) of the gate wiring line enlarges, the response rate of a scanning signal lowers, and the liquid crystal cannot be driven at high speed. By way of example, in a case where the specific resistance of a material forming the gate wiring line is 100 $\mu\Omega$cm, a screen size of 6-inch class is substantially an upper limit, but in a case where the specific resistance is 3 $\mu\Omega$cm, a screen size up to the 27-inch class can be coped with.

The scanning-signal driver circuit 404 and the image-signal driver circuit 405 are disposed peripherally of the display region 406. Since the lengths of the gate wiring lines of these driver circuits inevitably increase with the enlargement of the screen size of the display region, the gate wiring lines should preferably be formed of the low resistance material, such as aluminum (Al) or copper (Cu), mentioned in Example 2, in order to realize a large screen. Moreover, according to the present invention, input wiring lines 402, 403 extending from the input terminal 401 to the respective driver circuits can be formed of the same material as that of the gate wiring lines, and this can contribute to lowering wiring resistances.

On the other hand, in a case where the screen size of the display region is of 0.9-inch class, the length of a diagonal line becomes about 24 mm. Herein, when the TFTs are fabricated in accordance with submicron rules, they can be confined within 30×30 $mm^2$ with the peripheral driver circuits included. In such a case, the gate wiring lines need not always be formed of the low resistance material as mentioned in Example 2, but they can be formed of the same material as that of the gate electrodes, such as Ta or W.

The liquid crystal display device of such a construction can be finished up using the active matrix substrate which has been completed by applying any of the crystallizing methods explained in Embodiments 1~3, to Example 3. Anyway, the active matrix substrates completed by the crystallizing techniques explained in Embodiments 1~3 can be freely combined to fabricate the active matrix type liquid crystal display device.

EXAMPLE 5

Figure 24A:
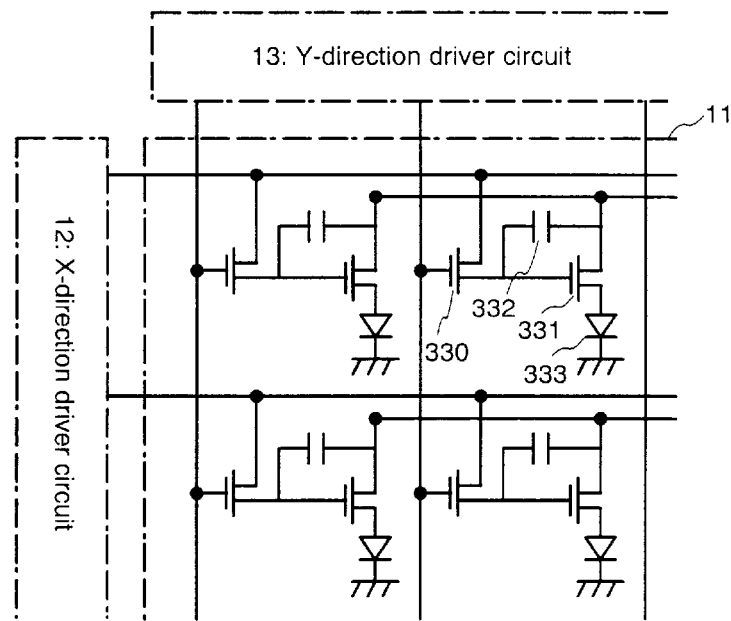
FIGS. 24A and 24B are a circuit diagram and a top plan view showing the construction of an EL display device of active matrix type.

In this example, the application of the present invention to a display device (organic EL display device), which employs an organic electroluminescent (organic EL) material of active matrix type, will be described with reference to FIGS. 24A and 24B. FIG. 24A shows a circuit diagram of the active matrix type organic EL display device. The organic EL display device is configured of a display region 11, an X-directional periphery driver circuit 12 and a Y-directional periphery driver circuit 13 which are disposed on a substrate. The display region 11 includes a switching TFT 330, a storage capacitor 332, a current controlling TFT 331, an organic EL element 333, X-directional signal lines 18a, 18b, power supply lines 19a, 19b, and Y-directional signal lines 20a, 20b, 20c.

Figure 24B:
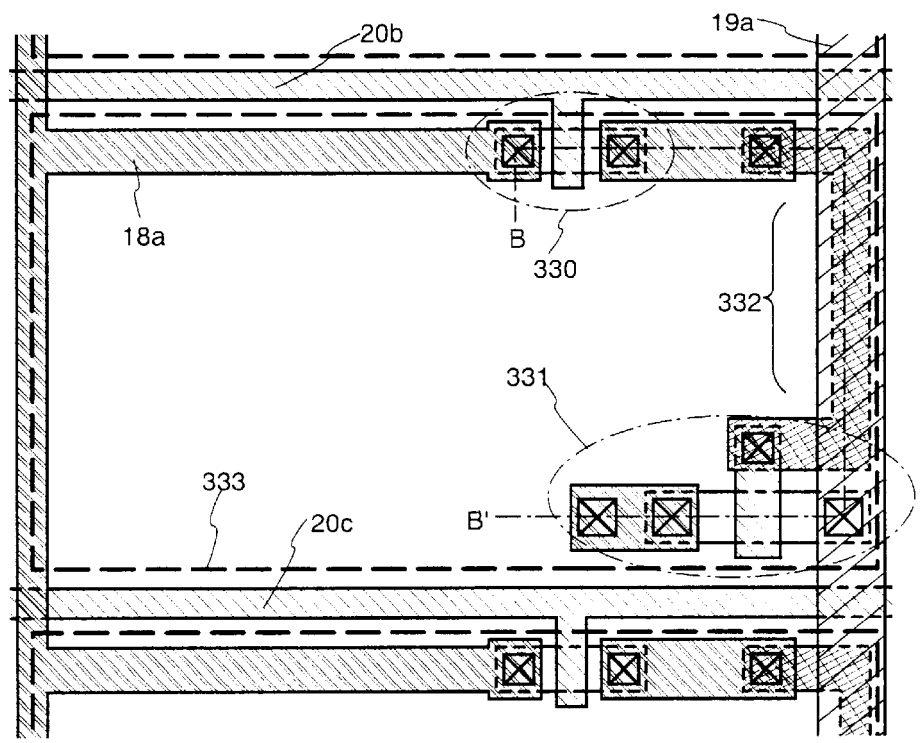

FIG. 24B shows a top plan view which corresponds substantially to one pixel. The switching TFT 330 may be formed likewise to the p-channel TFT 301 shown in FIG. 13, while the current controlling TFT 331 may be formed likewise to the n-channel TFT 303.

Meanwhile, in the case of the organic EL display device in an operation mode in which light is emitted upwards of the TFTs, pixel electrodes are made of reflective electrodes of Al or the like. Here in the example, the construction of the pixel region of the organic EL display device has been mentioned, but an active matrix type display device in a unitary peripheral circuit scheme, in which driver circuits are disposed peripherally of the pixel region as in Example 2, can also be fabricated. Besides, although no illustration is made, a color display can be presented by incorporating color filters. Anyway, the active matrix substrates furnished with the underlying layer explained in Embodiment 1 can be freely combined to fabricate the active matrix type organic EL display device.

EXAMPLE 6

An active matrix substrate, a liquid crystal display device and an EL display device formed by implementing the present invention can be used in various electro-optical devices. The present invention can be applied to all of the electronic devices having these electro-optical devices as the display medium. A personal computer, a digital camera, a video camera, a portable information terminal (a mobile computer, a portable telephone and an electronic book, etc.), a navigation system, etc., can be given as an example of the electronic device. Some examples of these are shown in FIGS. 25A to 26C.

Figure 25A:
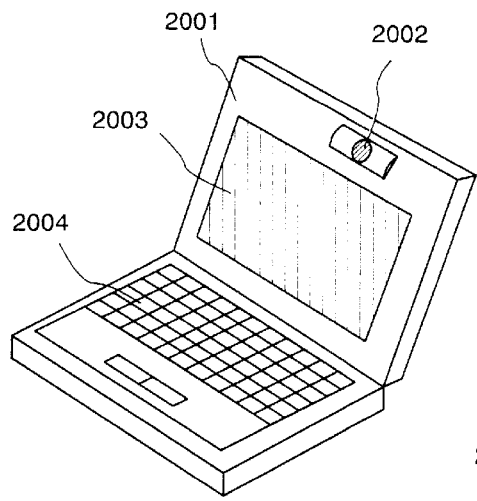
FIGS. 25A to 25F are schematic views each showing an example of a semiconductor device.

FIG. 25A is a personal computer, which comprises: a main body 2001 incorporating a micro-processor and a memory, etc.; an image input section 2002; a display device 2003; and a keyboard 2004. The present invention can form the display device 2003 or other signal processing circuits.

Figure 25B:
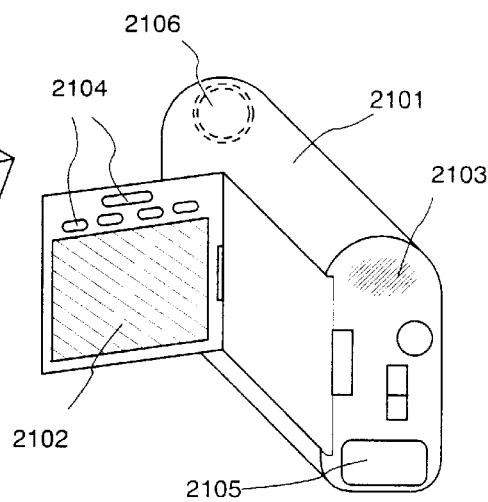

FIG. 25B is a video camera, which comprises a main body 2101; a display device 2102; a voice input section 2103; operation switches 2104; a battery 2105; and an image receiving section 2106. The present invention can be applied to the display device 2102 and other signal control circuits.

Figure 25C:
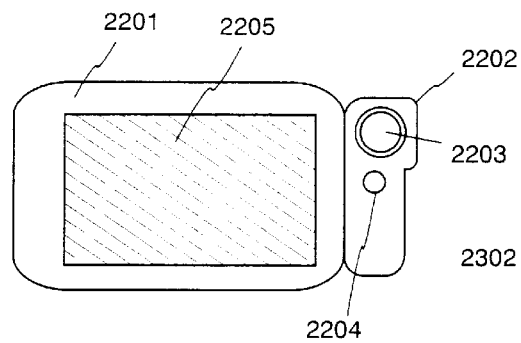

FIG. 25C is a portable information terminal, which comprises: a main body 2201; an image input section 2202; an image receiving section 2203; an operation switch 2204; and a display device 2205. The present invention can be applied to the display device 2205 or other signal control circuits.

Figure 25D:
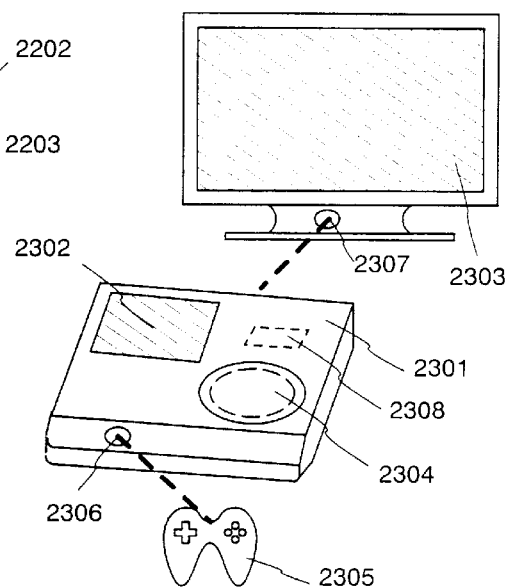

FIG. 25D is an electronic game machine such as a television game or a video game, comprising: a main body 2301 incorporated with an electronic circuit such as CPU, etc. 2308 and a recording medium 2304, etc.; a controller 2305; a display device 2303; and a display device 2302 incorporated into the main body 2301. The display device 2303 and the display device 2302 incorporated into the main body 2301 may display the same information, or alternatively the former may be used as a main display device, and the latter may be used as a secondary display device which may display information of the recording medium 2304, display the operation condition of the machine or it may be used as an operating board by adding a touch sensor function. Further, the main body 2301, the controller 2305 and the display device 2303 may adopt wire communication for mutually transmitting the signals, or may adopt wireless communication or optical communication by disposing sensor sections 2306 and 2307. The present invention can be applied to the display devices 2302 and 2303. Alternatively a conventional CRT can be used for the display device 2303.

Figure 25E:
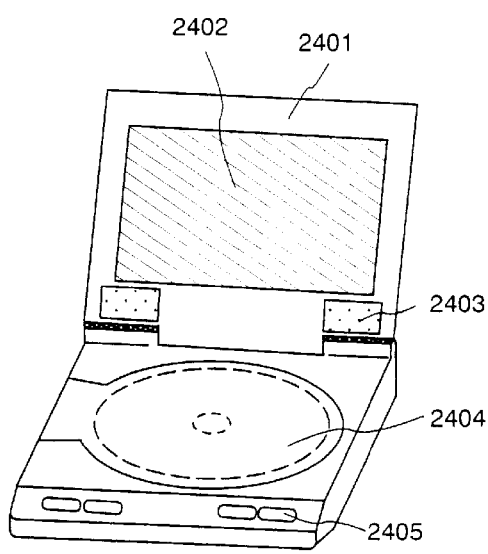

FIG. 25E is a player that uses a recording medium on which a program is recorded (hereinafter referred to as a recording medium), which comprises: a main body 2401; a display device 2402; a speaker section 2403; a recording medium 2404; and operation switches 2405. Note that music appreciation, film appreciation, games, and the use of the Internet can be performed with this device using a DVD (digital versatile disk), a CD, etc., as a recording medium. The present invention can be suitably applied to the display device 2402, and to other signal control circuits.

Figure 25F:
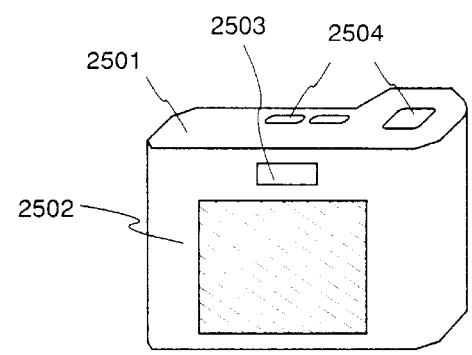

FIG. 25F is a digital camera, which comprises: a main body 2501; a display device 2502; a viewfinder 2503; operation switches 2504; and an image receiving section (not shown in the figure). The present invention can be applied to the display device 2502 and to other signal control circuits.

Figure 26A:
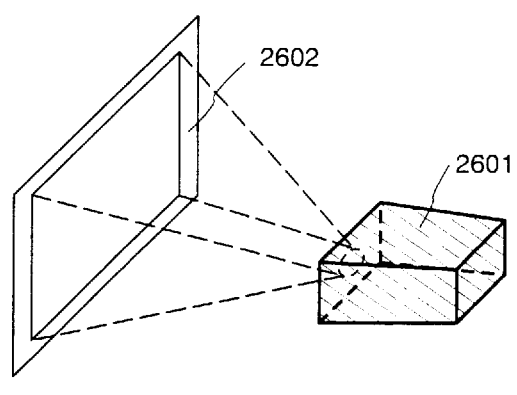
FIG. 26A to 26D are schematic views showing the construction of a liquid crystal display device of projection type.
Figure 26B:
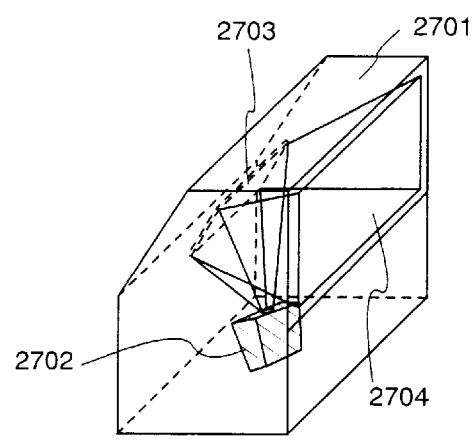

FIG. 26A is a front type projector, which comprises an optical light source system and a display device 2601 and a screen 2602. The present invention can be applied to the display device and to other signal control circuits. FIG. 26B is a rear type projector, which comprises: a main body 2701; an optical light source system and a display device 2702; a mirror 2703 and a screen 2704. The present invention can be applied to the display device and other signal control circuits.

Figure 26C:
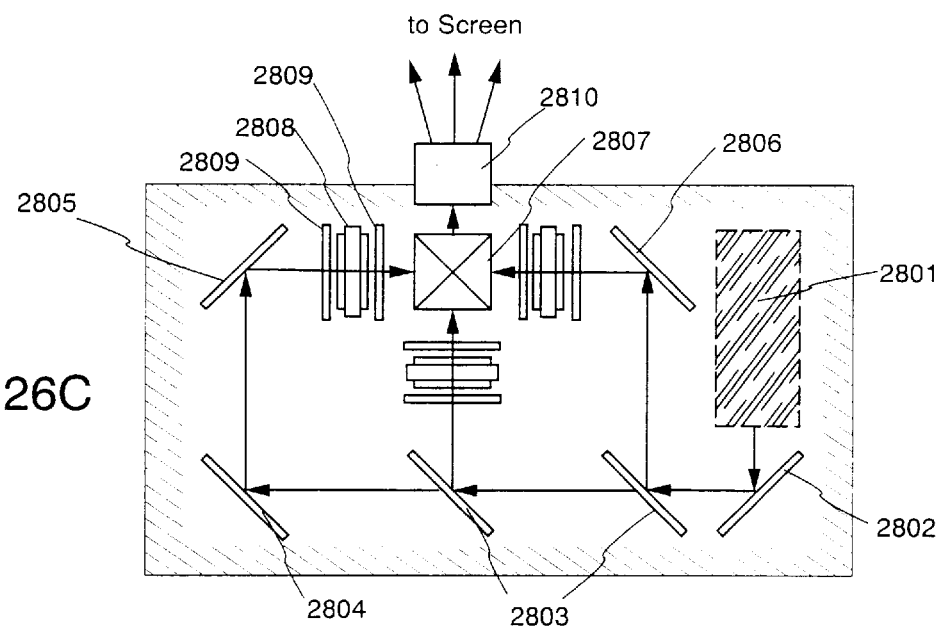
Figure 26D:
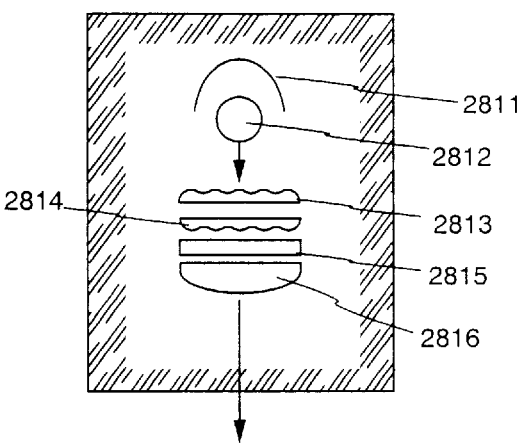

Note that FIG. 26C is a drawing showing one example of the structure of the optical light source systems and the display devices 2601 and 2702 of FIGS. 26A and 26B. The optical light source systems and the display devices 2601 and 2702 comprise: an optical light source system 2801; mirrors 2802 and 2804 to 2806; a dichroic mirror 2803; a beam splitter 2807; a liquid crystal display device 2808; a phase differentiating plate 2809; and an optical projection system 2810. The optical projection system 2810 is composed of a plurality of projection lens. FIG. 26C shows an example of triple stage using three liquid crystal display device 2808, but there are no special limits and it may be composed of an optical system of a single stage. Further, optical lenses, film having polarizing function, film to regulate the phase difference, IR films, etc., may be suitably disposed within the optical path shown by an arrow in FIG. 26C. In addition, FIG. 26D shows one example of the structure of the optical light source system 2801 from FIG. 26C. In embodiment 6, the optical light source system 2801 comprises: a reflector 2811; a light source 2812; lens arrays 2813 and 2814; a polarizing conversion element 2815; and a condensing lens 2816. Note that the optical light source system shown in FIG. 26D is merely an example and is not specifically limited to this structure.

In addition, though not shown in the figure here, it is also possible to apply the present invention to a navigation system or a read circuit of an image sensor, etc. The applicable range of the present invention is thus very large, and it is possible to apply the invention to electronic devices of various fields. The electronic devices of the present embodiment can be realized by using the crystallization technique of Embodiments 1 to 3 and by using any constituent combining any of Embodiments 1 to 6.

A crystalline semiconductor film in which the location and size of a crystal grain are controlled, can be prepared by employing the crystallizing technique of the present invention. It is permitted by setting the location of the crystal grain of such a crystalline semiconductor film in agreement with the channel forming region of a TFT to form, at least, this channel forming region out of one crystal grain, and to substantially attain characteristics comparable to those of a TFT prepared from a single-crystal semiconductor film. Such TFTs according to the present invention are applicable to various semiconductor devices, which include a liquid crystal display device of transmission type and an EL display device as well as an image sensor, whereby the performances of the semiconductor devices can be enhanced.

What is claimed is:

1. A method of fabricating a semiconductor device, comprising the steps of:
    forming a base film comprising an insulating film having a thermal nductivity of 10 $Wm^{-1}K^{-1}$ or less in contact with a substrate;
    forming an amorphous semiconductor film comprising silicon on said base film;
    forming a first protective insulating layer on said amorphous semiconductor film;
    selectively forming a thermal conduction layer having a thermal conductivity of 10 $Wm^{-1}K^{-1}$ or more on said first protective insulating layer;
    irradiating a laser beam from above said first protective insulating layer and said thermal conduction layer to crystallize said amorphous semiconductor film and to form a crystalline semiconductor film which has a crystal grain centering round said thermal conduction layer;
    selectively etching said crystalline semiconductor film to form an insular semiconductor film comprising a single crystal structure; and
    hydrogenating said insular semiconductor film to introduce hydrogen into said insular semiconductor film.

2. A method of fabricating a semiconductor device according to claim 1, wherein said substrate comprises a glass substrate.

3. A method of fabricating a semiconductor device according to claim 1, wherein said thermal conduction layer is formed of a material comprising at least one selected from the group consisting of aluminum oxide, aluminum nitride, oxidized aluminum nitride, silicon nitride and boron nitride.

4. A method of fabricating a semiconductor device according to claim 1, wherein said thermal conduction layer is formed of a compound material which contains Si, N, O and M (where letter M denotes at least one element selected from the group consisting of Al and a rare-earth element).

5. A method of fabricating a semiconductor device according to claim 1, wherein said base comprising said insulating film includes at least one layer which is made of a silicon oxynitride film having an oxygen concentration from 55 to 70 atomic % and a nitrogen concentration from 1 to 20 atomic %.

6. A method of fabricating a semiconductor device according to claim 1, wherein said semiconductor device is one selected from the group consisting of a personal computer, a video camera, a portable information terminal, a digital camera, a digital video disk player, an electronic game machine, and a projector.

7. A method of fabricating a semiconductor device according to claim 1, wherein said semiconductor device is an EL display device.

8. A method of fabricating a semiconductor device, comprising the steps of:
    forming a base film comprising an insulating film having a thermal conductivity of 10 $Wm^{-1}K^{-1}$ or less in contact with a substrate;
    forming an amorphous semiconductor film comprising silicon on said base film;
    forming a second protective insulating layer on said amorphous semiconductor film;
    forming an opening in said second protective insulating layer;
    forming a first protective insulating layer on said second protective insulating layer and in said opening;
    selectively forming a thermal conduction layer having a thermal conductivity of 10 $Wm^{-1}K^{-1}$ or more on said first protective insulating layer and substantially in said opening of said second protective insulating layer;
    irradiating a laser beam from above said first protective insulating layer and said thermal conduction layer to crystallize said amorphous semiconductor film and to form a crystalline semiconductor film which has a crystal grain centering round said thermal conduction layer;
    selectively etching said crystalline semiconductor film to form an insular semiconductor film comprising a single crystal structure; and
    hydrogenating said insular semiconductor film to introduce hydrogen into said insular semiconductor film.

9. A method of fabricating a semiconductor device according to claim 8, wherein said substrate comprises a glass substrate.

10. A method of fabricating a semiconductor device according to claim 8, wherein said thermal conduction layer is formed of a material comprising at least one selected from the group consisting of aluminum oxide, aluminum nitride, oxidized aluminum nitride, silicon nitride and boron nitride.

11. A method of fabricating a semiconductor device according to claim 8, wherein said thermal conduction layer is formed of a compound material which contains Si, N, O and M (where letter M denotes at least one element selected from the group consisting of Al and a rare-earth element).

12. A method of fabricating a semiconductor device according to claim 8, wherein said base comprising said insulating film includes at least one layer which is made of a silicon oxynitride film having an oxygen concentration from 55 to 70 atomic % and a nitrogen concentration from 1 to 20 atomic %.

13. A method of fabricating a semiconductor device according to claim 8, wherein said semiconductor device is one selected from the group consisting of a personal computer, a video camera, a portable information terminal, a digital camera, a digital video disk player, an electronic game machine, and a projector.

14. A method of fabricating a semiconductor device according to claim 8, wherein said semiconductor device is an EL display device.

15. A method of fabricating a semiconductor device comprising a thin film transistor over a substrate, comprising the steps of:

forming a base film comprising an insulating film having a thermal conductivity of 10 $Wm^{-1}K^{-1}$ or less in contact with said substrate;

forming an amorphous semiconductor film comprising silicon on said base film;

forming a first protective insulating layer on said amorphous semiconductor film;

selectively forming a thermal conduction layer having a thermal conductivity of 10 $Wm^{-1}K^{-1}$ or more on said first protective insulating layer;

irradiating a laser beam from above said first protective insulating layer and said thermal conduction layer to crystallize said amorphous semiconductor film and to form a crystalline semiconductor film which has a crystal grain centering round said thermal conduction layer;

selectively etching said crystalline semiconductor film to form an insular semiconductor film comprising a single crystal structure; and hydrogenating said insular semiconductor film to introduce hydrogen into said insular semiconductor film, wherein a channel forming region of said thin film transistor is formed of said insular semiconductor film comprising said single-crystal structure containing said hydrogen.

16. A method of fabricating a semiconductor device according to claim 15, wherein said substrate comprises a glass substrate.

17. A method of fabricating a semiconductor device according to claim 15, wherein said thermal conduction layer is formed of a material comprising at least one selected from the group consisting of aluminum oxide, aluminum nitride, oxidized aluminum nitride, silicon nitride and boron nitride.

18. A method of fabricating a semiconductor device according to claim 15, wherein said thermal conduction layer is formed of a compound material which contains Si, N, O and M (where letter M denotes at least one element selected from the group consisting of Al and a rare-earth element).

19. A method of fabricating a semiconductor device according to claim 15, herein said base comprising said insulating film includes at least one layer which is made of a silicon oxynitride film having an oxygen concentration from 55 to 70 atomic % and a nitrogen concentration from 1 to 20 atomic %.

20. A method of fabricating a semiconductor device according to claim 15, wherein said semiconductor device is one selected from the group consisting of a personal computer, a video camera, a portable information terminal, a digital camera, a digital video disk player, an electronic game machine, and a projector.

21. A method of fabricating a semiconductor device according to claim 15, wherein said semiconductor device is an EL display device.

22. A method of fabricating a semiconductor device comprising a thin film transistor is provided over a substrate, comprising the steps of:

forming a base film comprising an insulating film having a thermal conductivity of 10 $Wm^{-1}K^{-1}$ or less in contact with said substrate;

forming an amorphous semiconductor film comprising silicon on said base film;

forming a second protective insulating layer on said amorphous semiconductor film;

forming an opening in said second protective insulating layer;

forming a first protective insulating layer on said second protective insulating layer and in said opening;

selectively forming a thermal conduction layer having a thermal conductivity of 10 $Wm^{-1}K^{-1}$ or more on said first protective insulating layer and substantially in said opening of said second protective insulating layer;

irradiating a laser beam from above said first protective insulating layer and said thermal conduction layer to crystallize said amorphous semiconductor film and to form a crystalline semiconductor film which has a crystal grain centering round said thermal conduction layer;

selectively etching said crystalline semiconductor film to form an insular semiconductor film comprising a single crystal structure; and hydrogenating said insular semiconductor film to introduce hydrogen into said insular semiconductor film;

wherein a channel forming region of said thin film transistor is formed of said insular semiconductor film comprising said single crystal structure containing said hydrogen.

23. A method of fabricating a semiconductor device according to claim 22, wherein said substrate comprises a glass substrate.

24. A method of fabricating a semiconductor device according to claim 22, wherein said thermal conduction layer is formed of a material comprising at least one selected from the group consisting of aluminum oxide, aluminum nitride, oxidized aluminum nitride, silicon nitride and boron nitride.

25. A method of fabricating a semiconductor device according to claim 22, wherein said thermal conduction layer is formed of a compound material which contains Si, N, O and M (where letter M denotes at least one element selected from the group consisting of Al and a rare-earth element).

26. A method of fabricating a semiconductor device according to claim 22, wherein said base comprising said insulating film includes at least one layer which is made of a silicon oxynitride film having an oxygen concentration from 55 to 70 atomic % and a nitrogen concentration from 1 to 20 atomic %.

27. A method of fabricating a semiconductor device according to claim 22, wherein said semiconductor device is one selected from the group consisting of a personal computer, a video camera, a portable information terminal, a digital camera, a digital video disk player, an electronic game machine, and a projector.

28. A method of fabricating a semiconductor device according to claim 22, wherein said semiconductor device is an EL display device.

* * * * *